United States Patent
Imayama et al.

(10) Patent No.: US 7,038,542 B2
(45) Date of Patent: May 2, 2006

(54) VARIABLE GAIN AMPLIFIER

(75) Inventors: Teruo Imayama, Kawasaki (JP); Tsuneo Suzuki, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 10/968,008

(22) Filed: Oct. 20, 2004

(65) Prior Publication Data

US 2005/0110571 A1    May 26, 2005

(30) Foreign Application Priority Data

Oct. 22, 2003   (JP)   .............................. 2003-362177

(51) Int. Cl.
*H03F 3/45*     (2006.01)
(52) U.S. Cl. ........................ 330/254; 330/261; 330/295
(58) Field of Classification Search ................. 330/254, 330/261, 295
See application file for complete search history.

(56) References Cited

U.S. PATENT DOCUMENTS

| | | | | |
|---|---|---|---|---|
| 4,904,952 A | * | 2/1990 | Tanimoto | 330/252 |
| 5,418,494 A | * | 5/1995 | Betti et al. | 330/254 |
| 6,084,466 A | * | 7/2000 | Phanse et al. | 327/560 |
| 6,683,499 B1 | * | 1/2004 | Lautzenhiser et al. | 330/295 |
| 6,850,109 B1 | * | 2/2005 | Kimura | 327/361 |

FOREIGN PATENT DOCUMENTS

JP     2003-188667     7/2003

* cited by examiner

*Primary Examiner*—Patricia Nguyen
(74) *Attorney, Agent, or Firm*—Oblon, Spivak, McClelland, Maier & Neustadt, P.C.

(57) ABSTRACT

A variable gain amplifier includes a first constant current amplifier configured to generate a reference current from an input signal. A controller is configured to generate a bias current and a first control signal based on control voltage. An addition current generator is configured to generate a variable current from the input signal based on the bias current, and to generate a addition current by controlling the variable current in accordance with the first control signal. An adder is configured to generate a first output signal by adding the reference current and the addition current.

20 Claims, 16 Drawing Sheets

FIG. 8
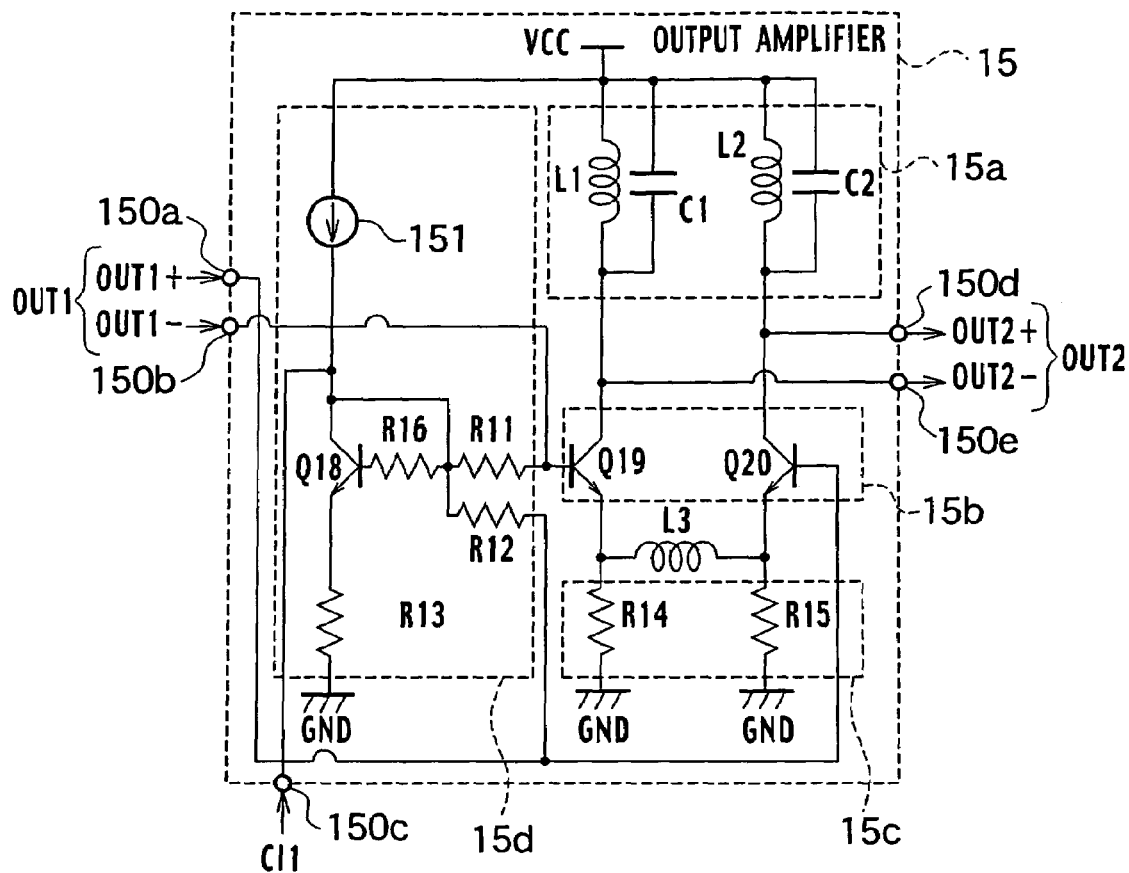
FIG. 9A
FIG. 9B
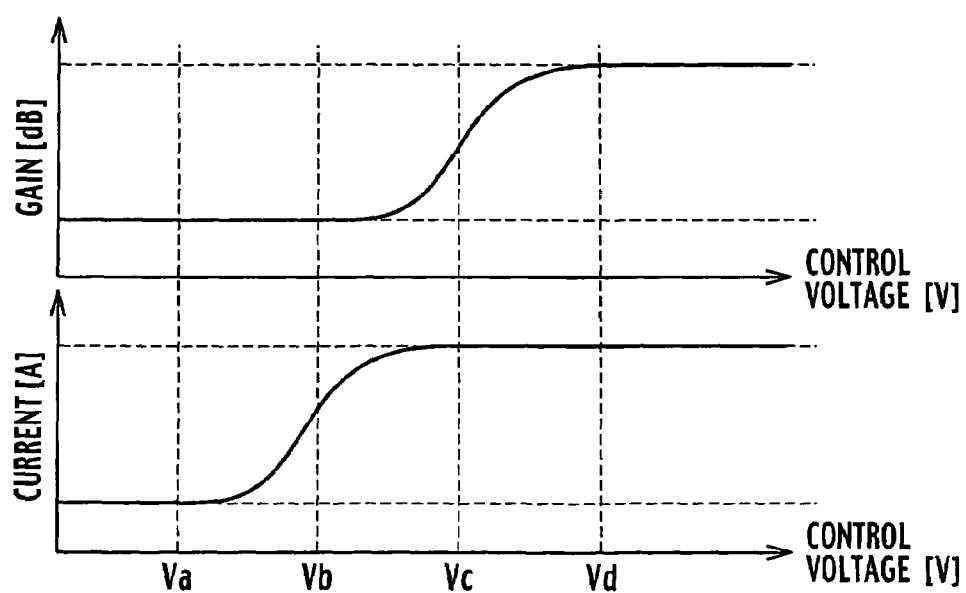

VARIABLE GAIN AMPLIFIER

CROSS REFERENCE TO RELATED APPLICATIONS

This application is based upon and claims the benefit of priority from prior Japanese Patent Application P2003-362177 filed on Oct. 22, 2003; the entire contents of which are incorporated by reference herein.

BACKGROUND OF THE INVENTION

1. Field of the Invention

The present invention relates to a variable gain amplifier used for radio terminals.

2. Description of the Related Art

Radio terminals such as a cellular phone include a variable gain amplifier having variable voltage gain in the transmitter and the receiver. Especially, in code division multiple access (CDMA) systems, more than 80 [dB] variable gain width is required for a variable gain amplifier because many terminals use the same frequency band. Since the variable gain width of an amplifier is from 20 to 30 [dB], it is common to configure the variable gain amplifier by combining a plurality of amplifiers. Furthermore, providing variable gain amplifiers capable of operating with low power consumption is desired, because the power consumption of the radio terminals is limited. For the purpose of reducing the power consumption of variable gain amplifiers, multi-stage variable gain amplifiers composed of an amplifier having variable voltage gain and an amplifier having variable output current has been proposed.

By decreasing the output current of the amplifiers comprising the variable gain amplifier, the reduction of power consumption of the entire variable gain amplifier is expected. However, in the aforementioned variable gain amplifier, it is not possible to reduce the power consumption of the variable gain amplifier because it is not possible to control the output current of the amplifier having variable voltage gain. In addition, each amplifier having variable voltage gain and the amplifier having variable output current includes a plurality of resistances for generating voltage. When the variable gain amplifier is integrated on a semiconductor chip, the necessity area and the dispersion of resistance value of the resistances creates a problem.

SUMMARY OF THE INVENTION

An aspect of the present invention provides a variable gain amplifier including a first constant current amplifier configured to generate a reference current from an input signal, a controller configured to generate a bias current and a first control signal based on a control voltage, an addition current generator configured to generate a variable current from the input signal based on the bias current, and to generate an addition current by controlling the variable current in accordance with the first control signal, and an adder configured to generate a first output signal by adding the reference current and the addition current.

Another aspect of the present invention provides a variable gain amplifier including a first constant current amplifier configured to generate a reference current from an input signal, a controller configured to generate first and second bias currents and first to third control signals based on a control voltage, an addition current generator configured to generate first to third addition currents based on the first and second bias currents and the first to third control signals, and an adder configured to generate a first output signal by adding the reference current and the first to third addition currents.

BRIEF DESCRIPTION OF THE DRAWINGS

FIG. 8 is a circuit diagram showing an output amplifier according to the first embodiment.

FIGS. 9A and 9B are graphs showing an operation of the variable gain amplifier according to the first embodiment.

DETAILED DESCRIPTION OF THE INVENTION

Figure 1:
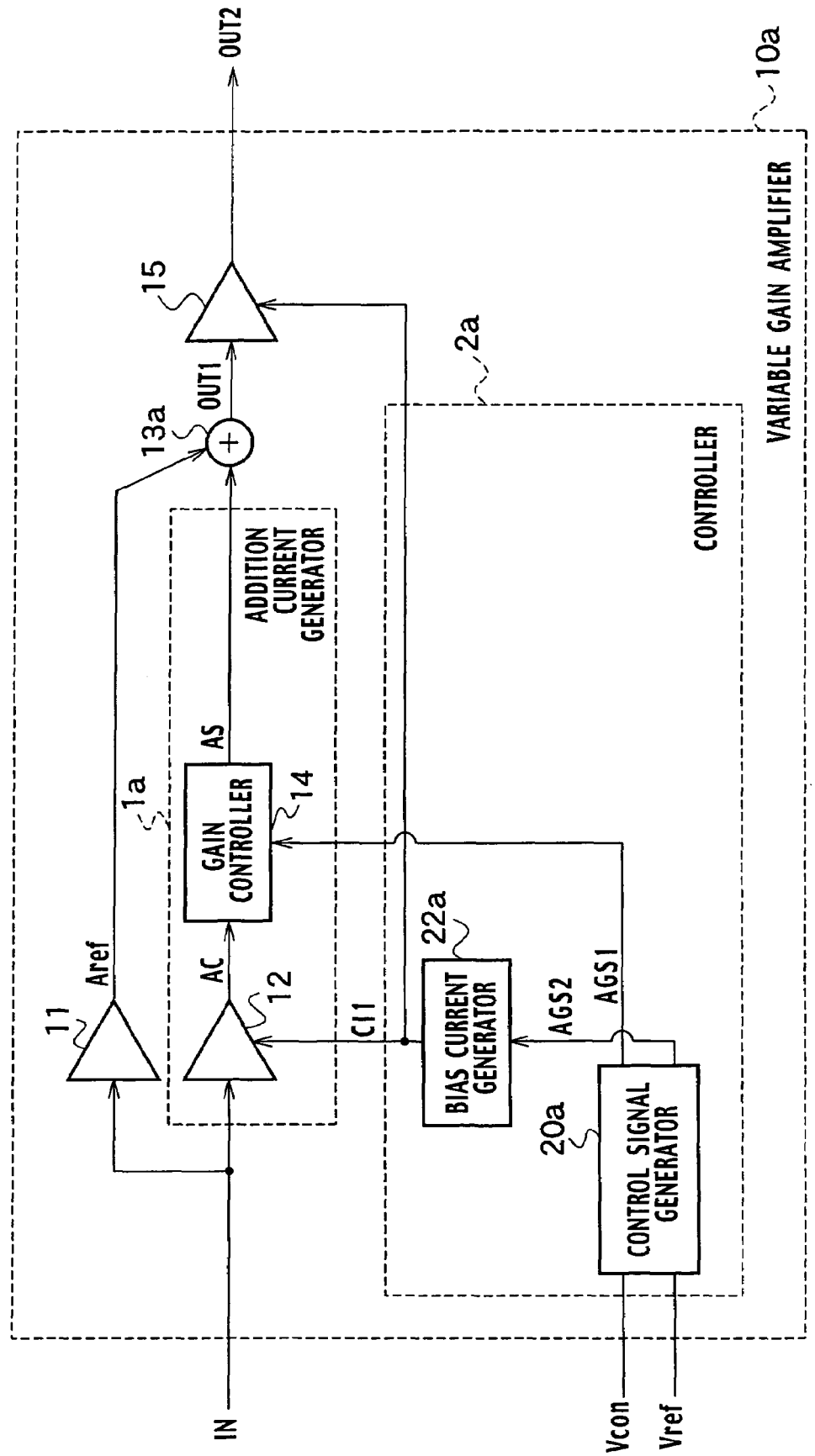
FIG. 1 is a block diagram showing a variable gain amplifier according to a first embodiment of the present invention.

Various embodiments of the present invention will be described with reference to the accompanying drawings. It is to be noted that the same or similar reference numerals are applied to the same or similar parts and elements throughout the drawings, and description of the same or similar parts and elements will be omitted or simplified. In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention with unnecessary detail. In the following description, the words "connect" or "connected" defines a state in which first and second elements are electrically connected to each other without regard to whether or not there is a physical connection between the elements.

First Embodiment

As shown in FIG. 1, a variable gain amplifier 10a according to a first embodiment of the present invention includes a constant current amplifier 11, an addition current generator 1a, an adder 13a, a controller 2a, and an output amplifier 15. The constant current amplifier 11 generates a reference current Aref from an input signal IN. The controller 2a generates a bias current CI1 and a first control signal AGS1 based on a control voltage Vcon. The addition current generator 1a generates a variable current AC from the input signal IN based on the bias current CI1, and generates an addition current AS by controlling the variable current AC in accordance with first control signal AGS1. The adder 13a generates a first output signal OUT1 by adding the reference current Aref and the addition current AS. The output amplifier 15 generates a second output signal OUT2 by amplifying the first output signal OUT1. The constant current amplifier 11, the addition current generator 1a, the controller 2a, the adder 13a, and the output amplifier 15 are configured as differential circuits, for example. The control voltage Vcon is supplied by a base band unit (not illustrated), for example.

The variable current AC is controlled by the bias current CI1. Therefore, when each input dynamic range of the constant current amplifier 11 and the variable current amplifier 12 is equal, the following equation (1) is established:

$$DR=20\log\{(Aref+AC)/Aref\} \quad (1)$$

where, "DR" [dB] is the variable gain width of the variable gain amplifier 10a, "Aref" [A] is the reference current Aref, and "AC" [A] is the variable current AC.

Furthermore, the controller 2a decreases the variable current AC after decreasing the the addition current AS when the voltage gain of the variable gain amplifier 10a is controlled from a high gain to a low gain. Specifically, the controller 2a decreases the output direct current component of variable current amplifier 12. Here, when the variable gain width of the variable gain amplifier 10a is 12 [dB] for example, by the equation (1), the ratio of the reference current Aref to the maximum variable current AC is 1:3. The variable current AC becomes zero when the variable gain amplifier 10a is a minimum gain.

Accordingly, the power consumption of the variable gain amplifier 10a in periods of minimum gain becomes ¼ compared with periods of maximum gain. As a result, excessive electric power consumed in period of low gain is reduced greatly. On the other hand, the controller 2a increases the addition current AS after increasing the variable current AC when controlling from a low gain to a high gain.

Moreover, the controller 2a includes a control signal generator 20a and a bias current generator 22a. The control signal generator 20a generates a first control signal AGS1 and a second control signal AGS2 in accordance with the potential difference of the control voltage Vcon and a reference voltage Vref having a constant voltage value. The bias current generator 22a generates the bias current CI1 in accordance with the second control signal AGS2. The bias current CI1 is supplied to the variable current amplifier 12 and the output amplifier 15.

Figure 2:
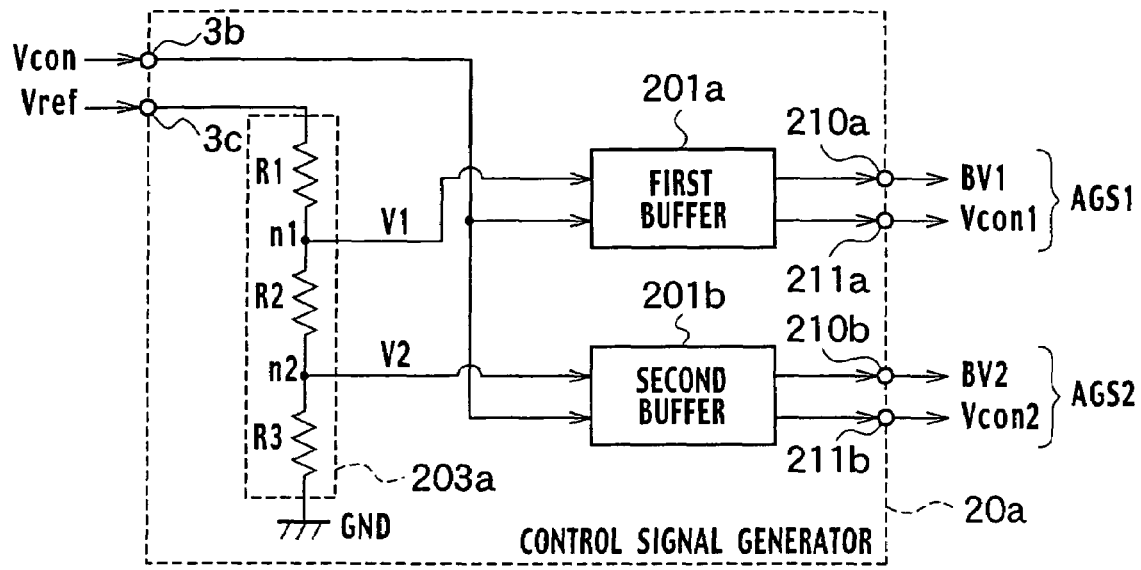
FIG. 2 is a circuit diagram showing a control signal generator according to the first embodiment.

As shown in FIG. 2, the control signal generator 20a includes a control voltage terminal 3b, a reference voltage terminal 3c, a first converted voltage output terminal 210a, a first converted control voltage output terminal 211a, a second converted voltage output terminal 210b, a second converted control voltage output terminal 211b, a voltage divider 203a, a first buffer 201a, and a second buffer 201b. The voltage divider 203a generates a first voltage V1 and a second voltage V2 by dividing the reference voltage Vref. The first buffer 201a generates first converted voltage BV1 and first converted control voltage Vcon1 based on the potential difference of the first voltage V1 and the control voltage Vcon. The first converted voltage BV1 and the first converted control voltage Vcon1 configure a first control signal AGS1. The second buffer 201b generates a second converted voltage BV2 and a second converted control voltage Vcon2 based on the potential difference of the second voltage V2 and the control voltage Vcon. The second converted voltage BV1 and the second converted control voltage Vcon2 configure a second control signal AGS2.

The voltage divider 203a includes a first dividing-resistance R1 connected to the reference voltage terminal 3c, a second dividing-resistance R2 connected to the first dividing-resistance R1, and a third dividing-resistance R3 connected between the second dividing-resistance R2 and a ground GND. The first buffer 201a has an input side connected to a connection node n1, and an output side connected to the first converted voltage output terminal 210a and the first converted control voltage output terminal 211a. The second buffer 201b has an input side connected to a connection node n2, and an output side connected to the second converted voltage output terminal 210b and the second converted control voltage output terminal 211b.

Figure 3:
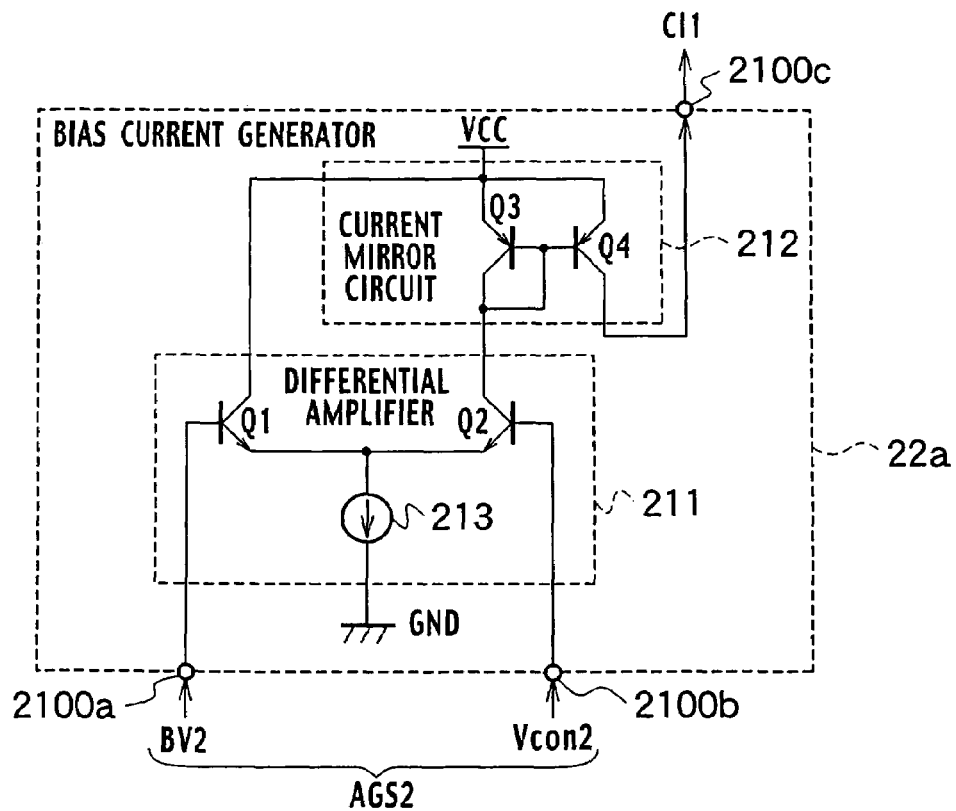
FIG. 3 is a circuit diagram showing a bias current generator according to the first embodiment.

As shown in FIG. 3, the bias current generator 22a includes a first current controlling input terminal 2100a, a second current controlling input terminal 2100b, a bias current output terminal 2100c, a differential amplifier 211, and a current mirror circuit 212. The differential amplifier 211 supplies a current to the current mirror circuit 212 in accordance with the potential difference of the second converted voltage BV2 and the second converted control voltage Vcon2. The current mirror circuit 212 generates the bias current CI1 based on the current from the differential amplifier 211.

The differential amplifier 211 includes a first differential transistor Q1, a second differential transistor Q2, and a constant current source 213. The first differential transistor Q1 has a collector connected to a power supply VCC, a base connected to the first current controlling input terminal 2100, and an emitter connected to the constant current source 213. The second differential transistor Q2 has a collector connected to the current mirror circuit 212, a base connected to second current controlling input terminal 2100b, and an emitter connected to the constant current source 213. The constant current source 213 is connected between each emitter of the first differential transistor Q1 and the second differential transistor Q2 and the ground GND. For example, npn bipolar junction transistors can be used as the first differential transistor Q1 and the second differential transistor Q2.

The current mirror circuit 212 includes a first mirror transistor Q3 and a second mirror transistor Q4. The first mirror transistor Q3 has an emitter connected to the power supply VCC, a base connected to the base of the second mirror transistor Q4, and a collector connected to the collector of the second differential transistor Q2. Furthermore, the collector of the first mirror transistor Q3 is connected to the base of the second mirror transistor Q4. The second mirror transistor Q4 has an emitter connected to the power supply VCC, a collector connected to the bias current output terminal 2100c. For example, pnp bipolar junction transistors can be used as the first mirror transistor Q3 and the second mirror transistor Q4.

On the other hand, the addition current generator 1a shown in FIG. 1 includes a variable current amplifier 12, and a gain controller 14 connected to the variable current amplifier 12. The variable current amplifier 12 generates the variable current AC based on the bias current CI1. The gain controller 14 generates the addition current AS by controlling the variable current AC in accordance with the first control signal AGS1.

Figure 4:
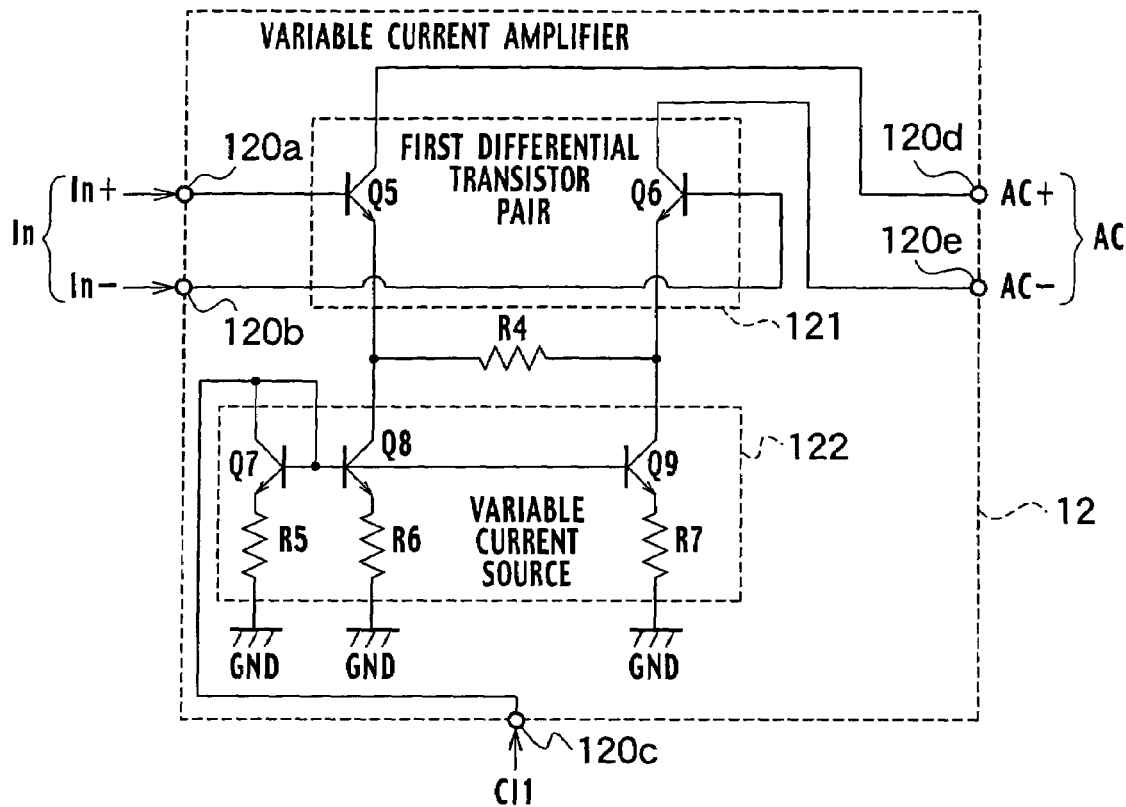
FIG. 4 is a circuit diagram showing a variable current amplifier according to the first embodiment.

As shown in FIG. 4, the variable current amplifier 12 includes a first input terminal 120a, a second input terminal 120b, a current controlling terminal 120c, a first variable current output terminal 120d, a second variable current output terminal 120e, a first differential transistor pair 121, a first degenerate resistance R4, and a variable current source 122. The first degenerate resistance R4 is used for expanding the input level range of the variable current amplifier 12. The variable current source 122 generates a current in accordance with the bias current CI1. The first differential transistor pair 121 controls the current from the variable current source 122 in accordance with the potential difference of a positive input signal In+ and a negative input signal In− having an opposite phase of the positive input signal In+, and generates a positive variable current AC+ and a negative variable current AC− composing the variable current AC. As a result, the current waveform of the variable current AC becomes a merged waveform of a direct current generated by the variable current source 122 with a signal generated by the first differential transistor pair 121.

The first differential transistor pair 121 includes a first voltage-current (V/I) conversion transistor Q5 and a second V/I conversion transistor Q6. The first V/I conversion transistor Q5 has a collector connected to the first variable current output terminal 120d, and a base connected to the first input terminal 120a. The second V/I conversion transistor Q6 has a collector connected to the second variable current output terminal 120e, and a base connected to the second input terminal 120b. The first degenerate resistance R4 is connected between each emitter of the first V/I conversion transistor Q5 and the second V/I conversion transistor Q6.

When the variable current amplifier 12 and the gain controller 14 are controlled at the same time, the distortion characteristic of the variable current AC increases because of the emitter resistance of each of the first V/I conversion transistor Q5 and the second V/I conversion transistor Q6. By the controller 2a shown in FIG. 1 decreases variable current AC after decreasing the addition current AS when controlling a change from a high gain to a low gain, it is possible to maintain a good the distortion characteristic.

The variable current source 122 is configured as a current mirror circuit. The variable current source 122 includes a first current setting transistor Q7, a second current setting transistor Q8, a third current setting transistor Q9, a first current setting resistance R5, a second current setting resistance R6, and a third current setting resistance R7. The first current setting resistance R5, the second current setting resistance R6, and the third current setting resistance R7 are connected to the ground GND. The first current setting transistor Q7 has a collector and a base connected to the current controlling terminal 120c, and an emitter connected to the first current setting resistance R5. The second current setting transistor Q8 has a collector connected to the emitter of the first V/I conversion transistor Q5, a base connected to the base of the first current setting transistor Q7, and an emitter connected to the second current setting resistance R6. The third current setting transistor Q9 has a collector connected to the emitter of the second V/I conversion transistor Q6, a base connected to the base of the first current setting transistor Q7, and an emitter connected to the third current setting resistance R7. For example, npn bipolar junction transistors can be used as the first V/I conversion transistor Q5, the second V/I conversion transistor Q6, the first current setting transistor Q7, the second current setting transistor Q8, and the third current setting transistor Q9.

Figure 5:
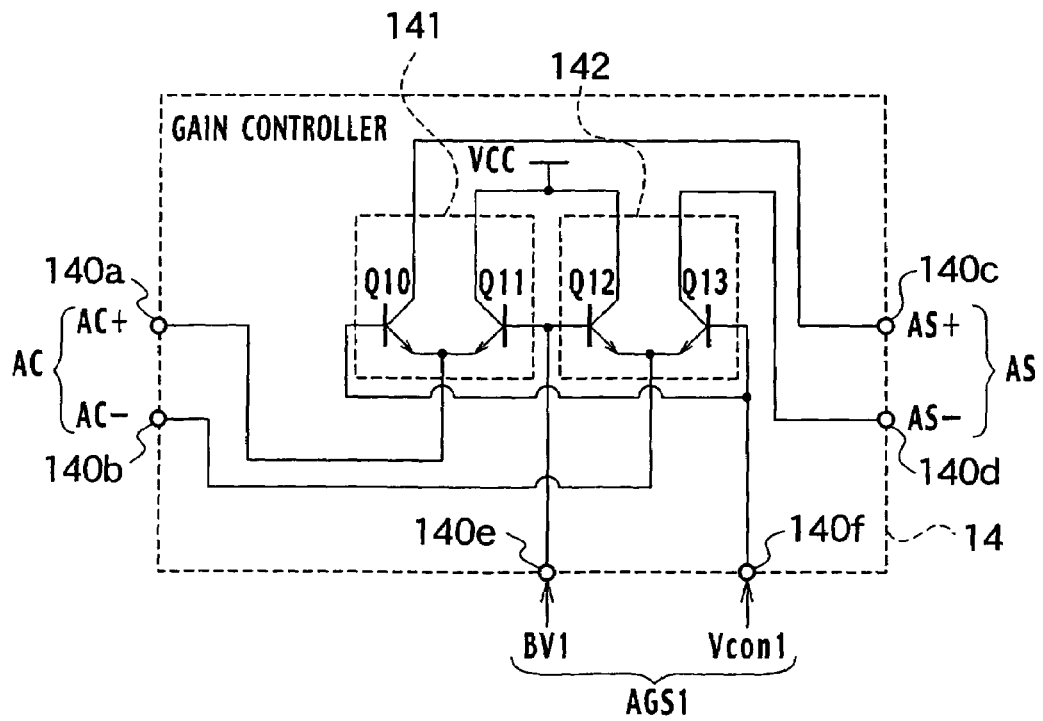
FIG. 5 is a circuit diagram showing a gain controller according to the first embodiment.

As shown in FIG. 5, the gain controller 14 includes a first variable current input terminal 140a, a second variable current input terminal 140b, a first addition current output terminal 140c, a second addition current output terminal 140d, a first converted voltage input terminal 140e, a first converted control voltage input terminal 140f, a second differential transistor pair 141, and a third differential transistor pair 142. When the voltage value of the first converted control voltage Vcon1 is larger than the voltage value of the first converted voltage BV1, the second differential transistor pair 141 generates a positive addition current AS+ of the addition current AS by amplifying the positive variable current AC+. When the voltage value of the first converted control voltage Vcon1 is larger than the voltage value of the first converted voltage BV1, the third differential transistor pair 142 generates a negative addition current AS− of the addition current AS by amplifying the negative variable current AC−.

Furthermore, the second differential transistor pair 141 includes a first gain controlling transistor Q10 and a second gain controlling transistor Q11. The first gain controlling transistor Q10 has a collector connected to the first addition variable current output terminal 140c, a base connected to the first converted control voltage input terminal 140f, and an emitter connected to the first variable current input terminal 140a. The second gain controlling transistor Q11 has a collector connected to the power supply VCC, a base connected to the first converted voltage input terminal 140e, and an emitter connected to first addition current input terminal 140a.

The third differential transistor pair 142 includes a third gain controlling transistor Q12 and a fourth gain controlling transistor Q13. The third gain controlling transistor Q12 has a collector connected to the power supply VCC, a base connected to the first converted voltage input terminal 140e, and an emitter connected to the second variable current input terminal 140b. The fourth gain controlling transistor Q13 has a collector connected to the second addition current output terminal 140d, a base connected to the first converted control voltage input terminal 140f, and an emitter connected to the second addition current input terminal 140b. For example, npn bipolar junction transistors can be used as the first to fourth gain controlling transistors Q10 to Q13.

Figure 6:
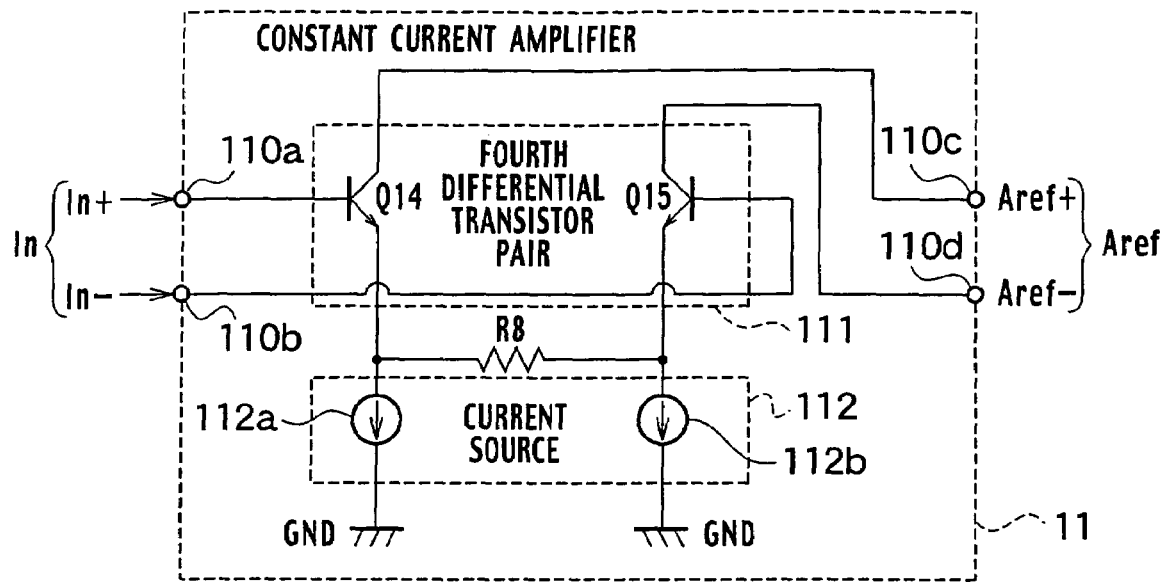
FIG. 6 is a circuit diagram showing a constant current amplifier according to the first embodiment.

As shown in FIG. 6, the constant current amplifier 11 includes a third input terminal 10a, a fourth input terminal 10b, a first reference current output terminal 110c, a second reference current output terminal 110d, a fourth differential transistor pair 111, a second degenerate resistance R8, and a current source 112. The current source 112 supplies a current to the fourth differential transistor pair 111. The fourth differential transistor pair 111 generates a positive reference current Aref+ and a negative reference current Aref− configuring the reference current Aref based on the positive input signal In+ and negative input signal In−. The second degenerate resistance R8 sets an input level range of the fourth differential transistor pair 111. The resistance value of the second degenerate resistance R8 is set larger than the resistance value of the first degenerate resistance R4 shown in FIG. 4.

Furthermore, the current source 112 includes a first current source 112a and a second current source 112b connected to the ground GND. The fourth differential transistor pair 111 includes a third V/I conversion transistor Q14 and a fourth V/I conversion transistor Q15. The third V/I conversion transistor Q14 has a collector connected to the first reference current output terminal 110c, a base connected to the third input terminal 10a, and an emitter connected to the first current source 112a. The fourth V/I conversion transistor Q15 has a collector connected to the second reference current output terminal 110d, a base connected to the fourth input terminal 110b, and an emitter connected to the second current source 112b. The second degenerate resistance R8 is connected between the emitter of the third V/I conversion transistor Q14 and the emitter of the fourth V/I conversion transistor Q15. For example, npn bipolar junction transistors can be used as the third V/I conversion transistor Q14 and the fourth V/I conversion transistor Q15.

Figure 7:
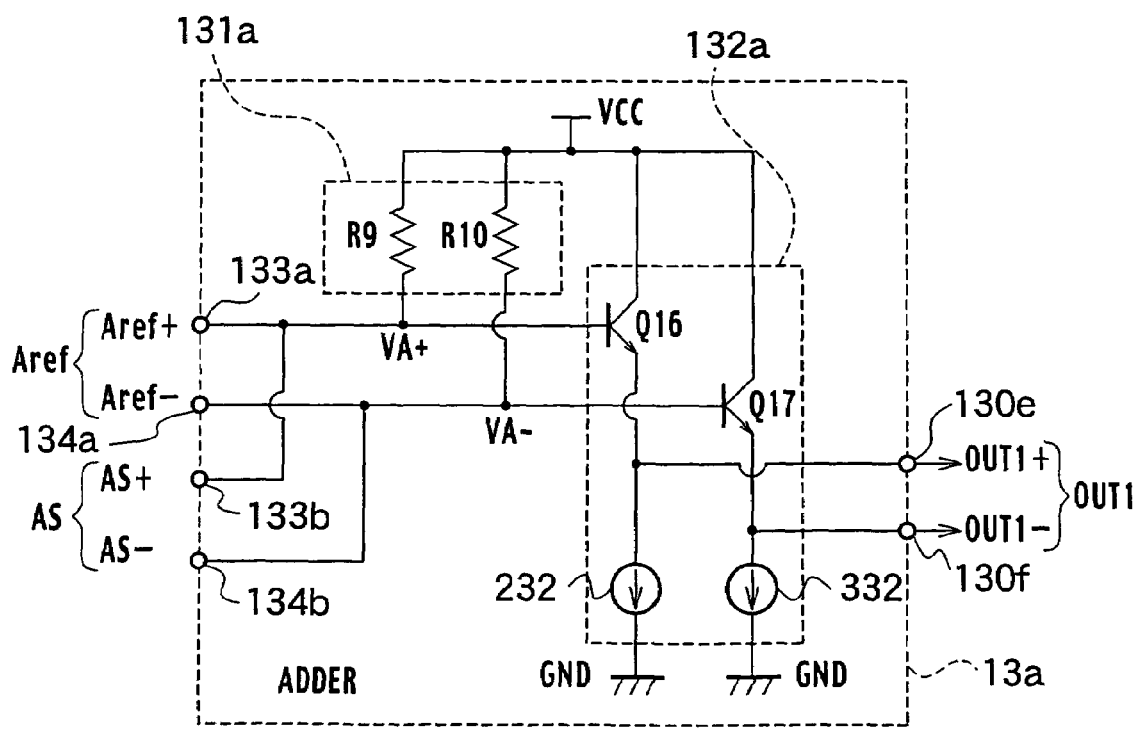
FIG. 7 is a circuit diagram showing an adder according to the first embodiment.

As shown in FIG. 7, the adder 13a includes a first reference current input terminal 133a, a second reference current input terminal 134a, a first positive addition current input terminal 133b, a first negative addition current input terminal 134b, a first output terminal 130e, a second output terminal 130f, a current-voltage converter 131a, and a voltage outputting circuit 132a. The current-voltage converter 131a generates a first addition voltage VA+ in accordance with the sum of the positive reference current Aref+ and the positive addition current AS+, and generates second addition voltage VA− in accordance with the sum of the negative reference current Aref− and the negative addition current AS−. The voltage outputting circuit 132a generates a positive output signal OUT1+ and a negative output signal OUT1− configuring the first output signal OUT1 based on the first addition voltage VA+ and the second addition voltage VA−.

The current-voltage converter 131a includes a first voltage generating resistance R9 and a second voltage generating resistance R10. The first voltage generating resistance R9 has one end connected to the power supply VCC, and another end connected to the first reference current input terminal 133a and the first addition current input terminal 133b. The second voltage generating resistance R10 has one end connected to the power supply VCC, and another end connected to the second reference current input terminal 134a and the second addition current input terminal 134b.

Moreover, the voltage outputting circuit 132a is configured as an emitter follower circuit. That is, the voltage outputting circuit 132a includes a first outputting transistor Q16, a second outputting transistor Q17, a first outputting current source 232, and a second outputting current source 332. The first outputting current source 232 and the second outputting current source 332 are connected to the ground GND. The first outputting transistor Q16 has a collector connected to the power supply VCC, a base connected to the first reference current input terminal 133a and the first positive addition current input terminal 133b, and an emitter connected to the first outputting current source 232. The second outputting transistor Q17 has a collector connected to the power supply VCC, a base connected to the second reference current input terminal 134a and the second negative addition current input terminal 134b, and an emitter connected to the second outputting current source 332. For example, npn bipolar junction transistors can be used as the first outputting transistor Q16 and the second outputting transistor Q17.

As shown in FIG. 8, the output amplifier 15 includes a first output signal terminal 150a, a second output signal terminal 150b, an outputting bias current terminal 150c, a first amplification output terminal 150d, a second amplification output terminal 150e, a tuning circuit 15a, a fifth differential transistor pair 15b, a outputting current source 15c, a output controller 15d, and a degenerate inductor L3. The tuning circuit 15a oscillates at a particular tuning frequency. The fifth differential transistor pair 15b generates a positive second output signal OUT2+ and a negative second output signal OUT2− configuring the second output signal OUT2 by selectively amplifying a signal component at the tuning frequency band of the tuning circuit 15a based on the positive output signal OUT1+ and the negative output signal OUT1−. The output controller 15d controls the positive second output signal OUT2+ and the negative second output signal OUT2− based on the bias current CI1.

The outputting current source 15c includes a first current generating resistance R14 and a second current generating resistance R15 connected to the ground GND. The tuning circuit 15a includes two LC tuning circuits. That is, the tuning circuit 15a includes a first inductor L1 connected between the power supply VCC and the first amplification output terminal 150e, a first capacitor C1 connected in parallel with first inductor L1, a second inductor L2 connected between the power supply VCC and the second amplification output terminal 150d, and a second capacitor C2 connected in parallel with the second inductor L2. The first capacitor C1 and the second capacitor C2 may be omitted.

The fifth differential transistor pair 15b includes a third outputting transistor Q19 and a fourth outputting transistor Q20. The third outputting transistor Q19 has a collector connected to the first amplification output terminal 150e, a base connected to the second output signal terminal 150b, and an emitter connected to the first current generating resistance R14. The fourth outputting transistor Q20 has a collector connected to the second amplification output terminal 150d, a base connected to the first output signal terminal 150a, and an emitter connected to the second current generating resistance R15. The degenerate inductor L3 is connected between the emitter of the third outputting transistor Q19 and the emitter of the fourth outputting transistor Q20.

The output controller 15d includes a first output controlling resistance R11, a second output controlling resistance R12, a third output controlling resistance R13, a fourth output controlling resistance R16, an output controlling transistor Q18, and an output controlling current source 151. When the bias current CI1 is zero, the output controller 15d equalizes each of the positive second output signal OUT2+ and the negative second output signal OUT2− to the output current of the output controlling current source 151.

Next, an operation of the variable gain amplifier 10a according to the first embodiment of the present invention will be described by referring of FIGS. 1 to 9B. An example in which the voltage gain of the variable gain amplifier 10a is decreased will be described. Here, FIG. 9A shows the gain of the gain controller 14 shown in FIG. 1, and FIG. 9B shows the variable current AC.

(A) When the voltage value of the control voltage Vcon is decreased from Vd [V] to Vc [V] gradually as shown in FIGS. 9A and 9B, the voltage value of the first converted control voltage Vcon1 shown in FIG. 2 approaches the voltage value of the first converted voltage BV1 gradually. When the voltage value of the first converted control voltage Vcon1 approaches the voltage value of the first converted voltage BV1 gradually, each collector current of the first gain controlling transistor Q10 and the fourth gain controlling transistor Q13 shown in FIG. 5, that is, each of the positive addition current AS+ and the negative addition current AS− is decreased.

(B) When each of the positive addition current AS+ and the negative addition current AS− is decreased, the gain of the gain controller 14 decreases gradually as shown in FIG. 9A. Here, the ratio of the reference current Aref to the addition current AS is 1:0.25 for example, the variable current amplifier 12 is controlled.

(C) When the voltage value of the control voltage Vcon is decreased from Vc [V] to Vb [V] gradually, the voltage value of the second converted control voltage Vcon2 shown in FIG. 2 approaches the voltage value of the second converted voltage BV2 gradually. When the voltage value of the second converted control voltage Vcon2 shown in FIG. 2 approaches the voltage value of the second converted voltage BV2 gradually, the collector current of the second differential transistor Q2 shown in FIG. 3 is decreased gradually. When the collector current of the second differential transistor Q2 is decreased gradually, the collector current of the second mirror transistor Q4, that is, the bias current CI1 is decreased gradually.

(D) When the bias current CI1 is decreased gradually, each collector current of the second current setting transistor Q8 and the third current setting transistor Q9 shown in FIG. 4 is decreased gradually. When the each collector current of the second current setting transistor Q8 and the third current setting transistor Q9 is decreased gradually, each of the positive variable current AC+ and the negative variable current AC− is decreased. Furthermore, the output controller 15d shown in FIG. 8 decreases the second output signal OUT2 in proportion to decrease in bias current CI1. As shown in FIG. 9B, each of the variable current AC and the bias current CI1 becomes zero when the voltage value of the control voltage Vcon is decreased until Va [V].

As described above, according to the first embodiment of the present invention, the power consumption of the entire variable gain amplifier 10a can be reduced because excess electric power is not consumed in periods of low gain. Furthermore, since the output current of the output amplifier 15 having a large power consumption is controlled by the bias current CI1, it is possible to reduce the power consumption of the variable gain amplifier 10a greatly. Moreover, since each output of the constant current amplifier 11, the variable current amplifier 12, and the gain controller 14 is current, it is possible to reduce the amount of resistance for generating voltage in the variable gain amplifier 10a.

(First Modification of First Embodiment)

Figure 10:
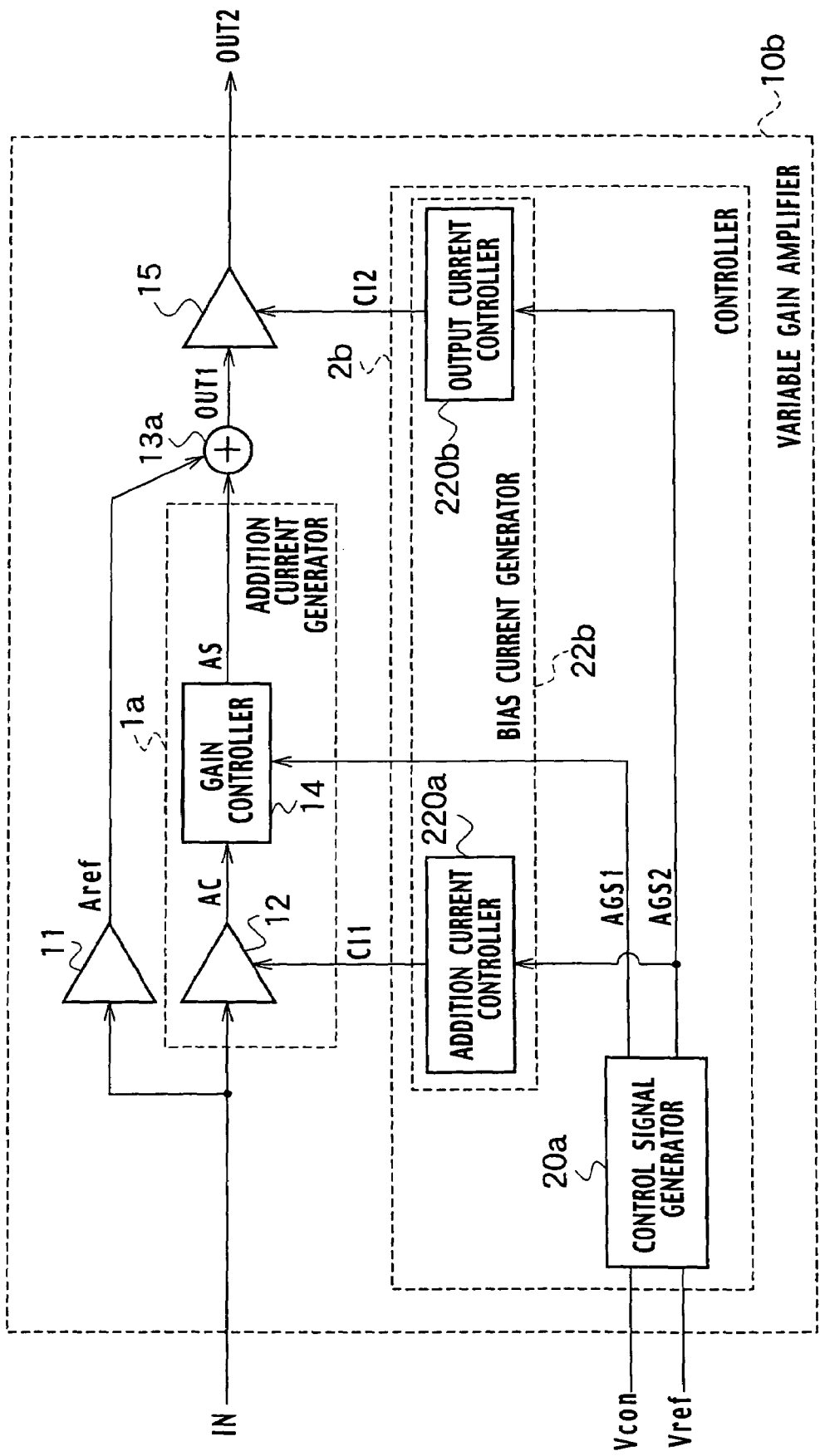
FIG. 10 is a block diagram showing a variable gain amplifier according to a modification of the first embodiment.

As a variable gain amplifier 10b according to a first modification of the first embodiment of the present invention, as shown in FIG. 10, a bias current generator 22b may include an addition current controller 220a and an output current controller 220b. The addition current controller 220a supplies a bias current CI1 to variable current amplifier 12 based on the second control signal AGS2. The output current controller 220b supplies a bias current CI2 to the output amplifier 15 based on the first control signal AGS1. The addition current controller 220a and the output current controller 220b are configured the same as the bias current generator 22a shown in FIG. 3.

According to the variable gain amplifier 10b shown in FIG. 10, it is possible to control the variable current amplifier 12 and the output amplifier 15 at a different timing. Therefore, it is possible to decrease the output current of the variable current amplifier 12 after decreasing the output current of the output amplifier 15 having a large output current.

Second Embodiment

Figure 11:
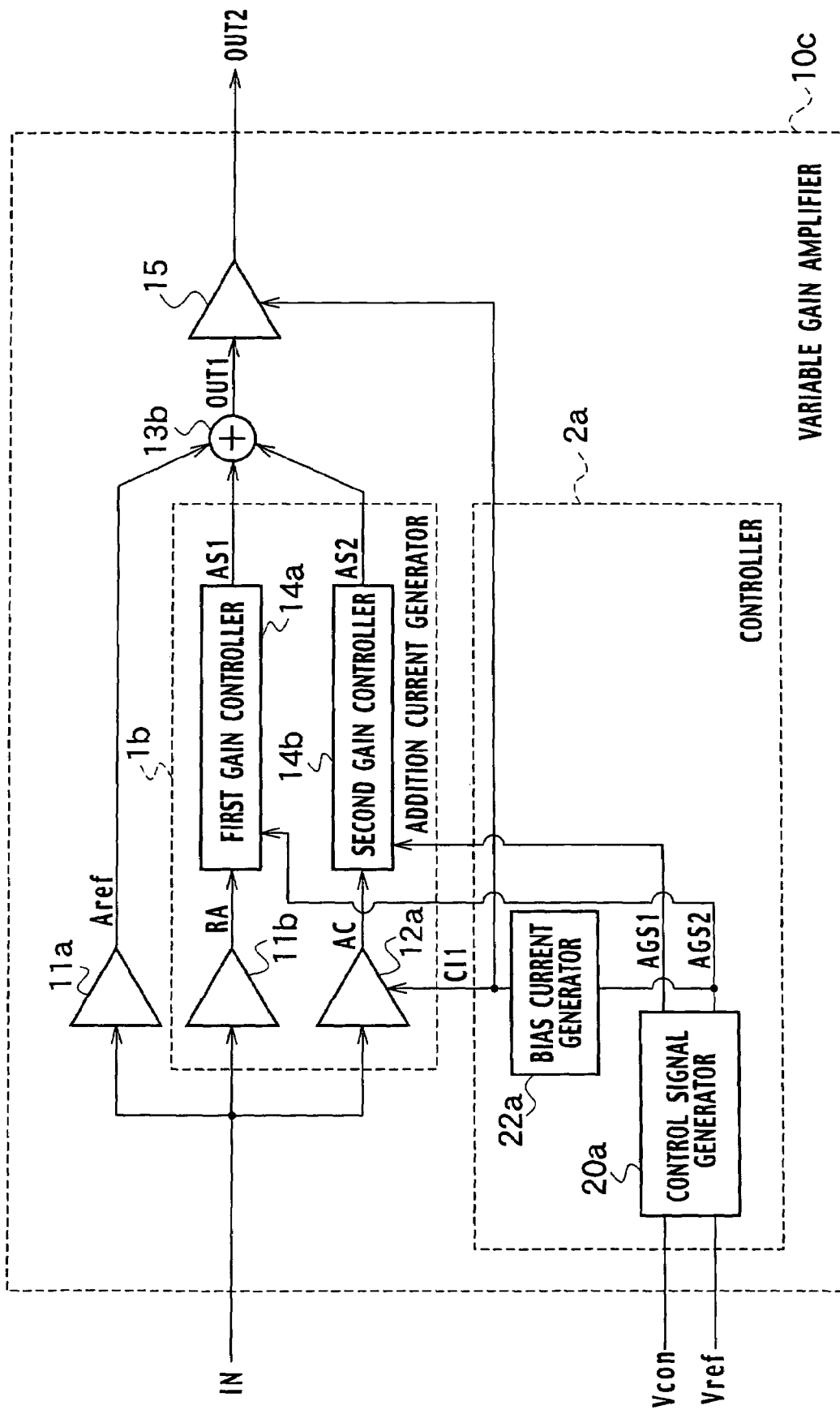
FIG. 11 is a block diagram showing a variable gain amplifier according to a second embodiment of the present invention.

As shown in FIG. 11, a variable gain amplifier 10c according to a second embodiment of the present invention differs from the addition current generator 1a shown in FIG. 1 in that an addition current generator 1b shown in FIG. 11 includes a second constant current amplifier 11b, a first gain controller 14a, a variable current amplifier 12a, and a second gain controller 14b.

The second constant current amplifier 11b generates a constant current RA from the input signal IN. The first gain controller 14a generates a first addition current AS1 by controlling the constant current RA in accordance with the second control signal AGS2. The variable current amplifier 12a generates a variable current AC based on the bias current CI1. The second gain controller 14b generates a second addition current AS2 by controlling the variable current AC in accordance with the first control signal AGS1.

Figure 12:
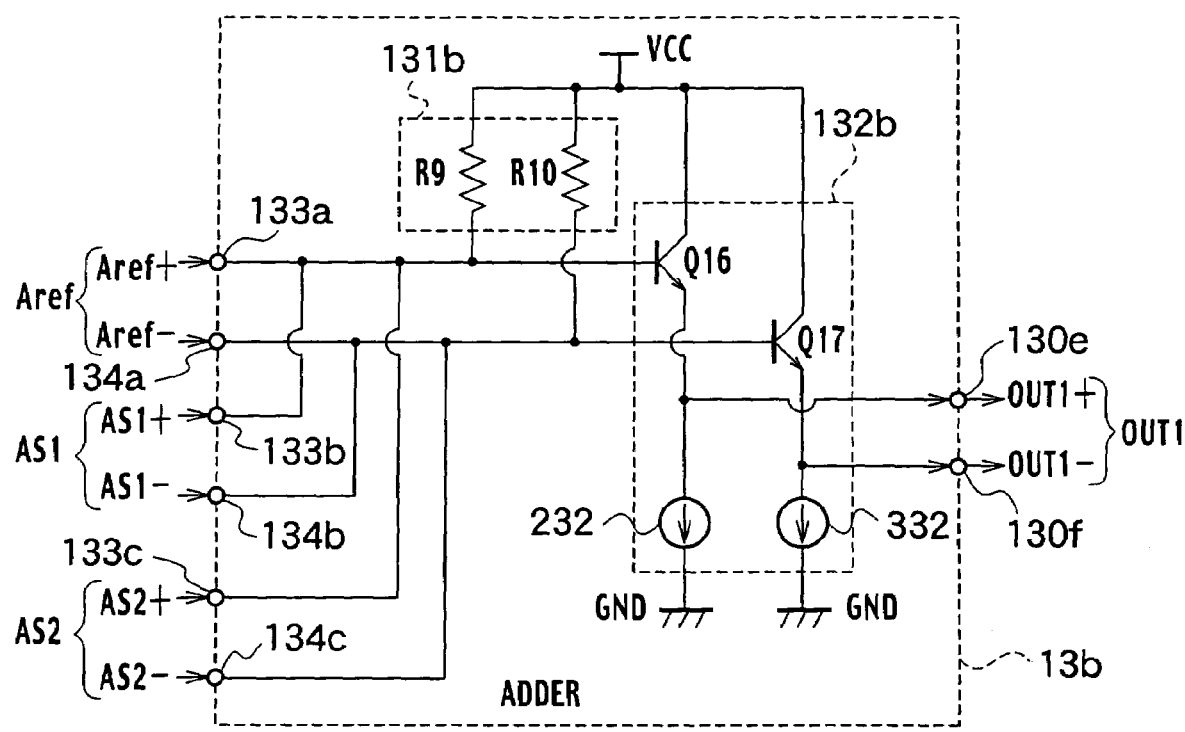
FIG. 12 is a circuit diagram showing an adder according to the second embodiment.

As shown in FIG. 12, an adder 13b differs form the adder 13a shown in FIG. 7 in that the adder 13b further includes a second positive addition current input terminal 133c, and a second negative addition current input terminal 134c. The maximum current of the variable current AC is larger than the constant current RA. Other components and configurations are similar to the variable gain amplifier 10a shown in FIG. 1.

With respect to the variable gain amplifier 10c, when each input dynamic range of the constant current amplifier 11a, the second constant current amplifier 11b, and the variable current amplifier 12a is equal, the following equation (2) is established:

$$DR=20\log\{(Aref+RA+AC)/Aref\} \tag{2}$$

where, "Aref" [A] is the reference current Aref, "RA" [A] is the constant current RA, "AC" [A] is the variable current AC, "DR" [dB] is the variable gain width of the variable gain amplifier 10c.

The controller 2a decreases the first addition current AS1 after decreasing the second addition current AS2 when the voltage gain of the variable gain amplifier 10c is controlled from a high gain to a low gain.

Next, an operation of the variable gain amplifier 10c according to the second embodiment of the present invention will be described by referring to FIGS. 11 to 13E. An example in which the voltage gain of the entire variable gain amplifier 10c is controlled from a high gain to a low gain will be described. However, repeated descriptions for the same operation of the second embodiment which are the same as the first embodiment are omitted. Here, FIG. 13A shows the gain of second gain controller 14b shown in FIG. 11, FIG. 13B shows the gain of first gain controller 14a, FIG. 13C shows the variable current AC, FIG. 13D shows the output current of the output amplifier 15, and FIG. 13E shows the voltage gain of whole variable gain amplifier 10c.

Figure 13A:
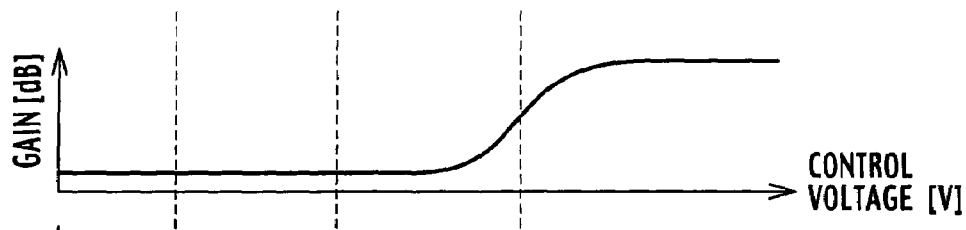
FIGS. 13A to 13E are graphs showing an operation of the variable gain amplifier according to the second embodiment.

(A) As shown in FIG. 13A, when the voltage value of the control voltage Vcon is in the neighborhood of C [V], the control signal generator 20a shown in FIG. 11 decreases the gain of the second gain controller 14b and the second addition current AS2 by using the first control signal AGS1.

Figure 13B:
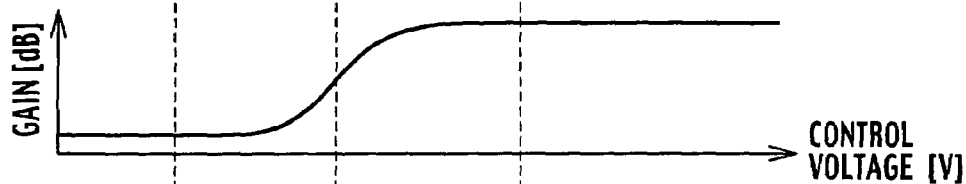

(B) As shown in FIG. 13B, when the voltage value of the control voltage Vcon is in the neighborhood of B [V], the control signal generator 20a decreases the gain of first gain controller 14a and the first addition current AS1 by using the second control signal AGS2. As shown in FIG. 13E, in a voltage range of B [V] to C [V] of the control voltage Vcon, the voltage gain of the entire variable gain amplifier 10c is decreased.

Figure 13C:
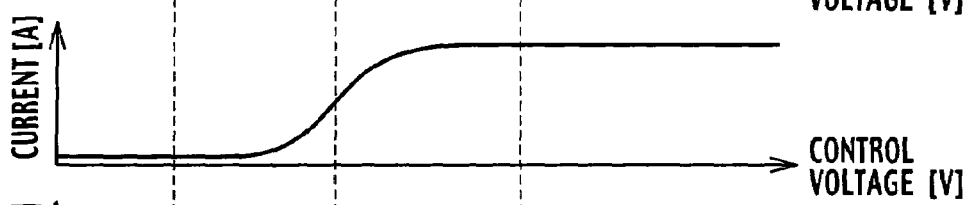
Figure 13D:
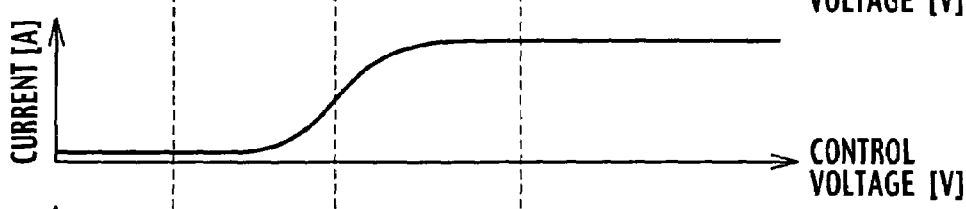
Figure 13E:
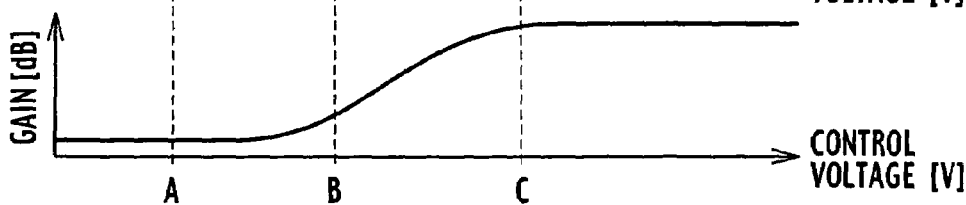

(C) As shown in FIG. 13C, when the voltage value of the control voltage Vcon is in the neighborhood of B [V], the bias current generator 22a shown in FIG. 11 decreases the variable current AC based on the second control signal AGS2. Moreover, as shown in FIG. 13D, the bias current generator 22a decreases the output current of the output amplifier 15 based on the second control signal AGS2.

As described above, according to the second embodiment, it is possible to control the variable current AC to minimum, in periods of the low voltage gain of the variable gain amplifier 10c. Therefore, it is possible to provide the variable gain amplifier 10c which is capable of operating with low power consumption. Furthermore, since each output of the second constant current amplifier 11b, the variable current amplifier 12a, the first gain controller 14a, and the second gain controller 14b is current, it is possible to reduce the amount of resistance for generating voltage in the variable gain amplifier 10c.

Third Embodiment

Figure 14:
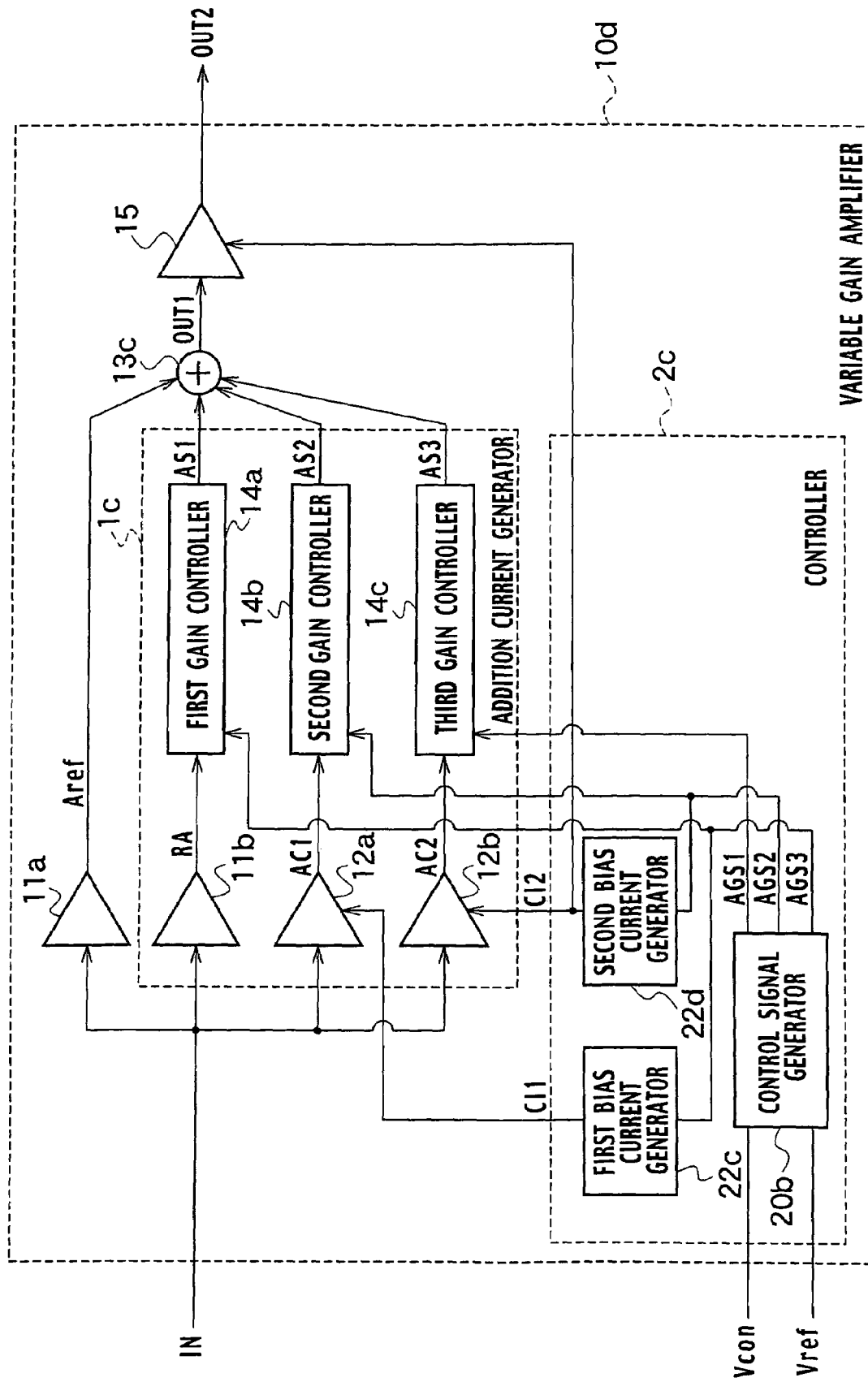
FIG. 14 is a block diagram showing a variable gain amplifier according to a third embodiment of the present invention.

As shown in FIG. 14, with respect to a variable gain amplifier 10d according to a third embodiment of the present invention, a controller 2c includes a control signal generator 20b, a first bias current generator 22c, and a second bias current generator 22d. The control signal generator 20b generates a first control signal AGS1, a second control signal AGS2, and a third control signal AGS3 based on the potential difference of the reference voltage Vref and the control voltage Vcon. The first bias current generator 22c generates a first bias current CI1 in accordance with the third control signal AGS3. The second bias current generator 22d generates a second bias current CI2 in accordance with the second control signal AGS2.

The addition current generator 1c includes a second constant current amplifier 11b, a first gain controller 14a, a first variable current amplifier 12a, a second gain controller 14b, a second variable current amplifier 12b, and a third gain controller 14c. The second constant current amplifier 11b generates a constant current RA from the input signal IN. The first gain controller 14a generates a first addition current AS1 by controlling the constant current RA in accordance with the third control signal AGS3. The first variable current amplifier 12a generates a first variable current AC1 based on a first bias current CI1. The second gain controller 14b generates a second addition current AS2 by controlling the first variable current AC1 in accordance with the second control signal AGS2. The second variable current amplifier 12b generates a second variable current AC2 based on the second bias current. The third gain controller 14c generates a third addition current AS3 by controlling the second variable current AC2 in accordance with the first control signal AGS1. Other compositions are similar to the variable gain amplifier 10a shown in FIG. 1.

Moreover, regarding the variable gain amplifier 10d, when each input dynamic range of the constant current amplifier 11a, the second constant current amplifier 11b, the first variable current amplifier 12a, and the second variable current amplifier 12b is equal, the following equation (3) is established:

$$DR = 20\log\{(Aref + RA + AC1 + AC2)/Aref\} \quad (3)$$

where, "Aref" [A] is the reference current Aref, "RA" [A] is the constant current RA, "AC1" [A] is the first variable current AC1, "AC2" [A] is the second variable current AC2, and "DR" [dB] is the variable gain width of the variable gain amplifier 10d.

Figure 15:
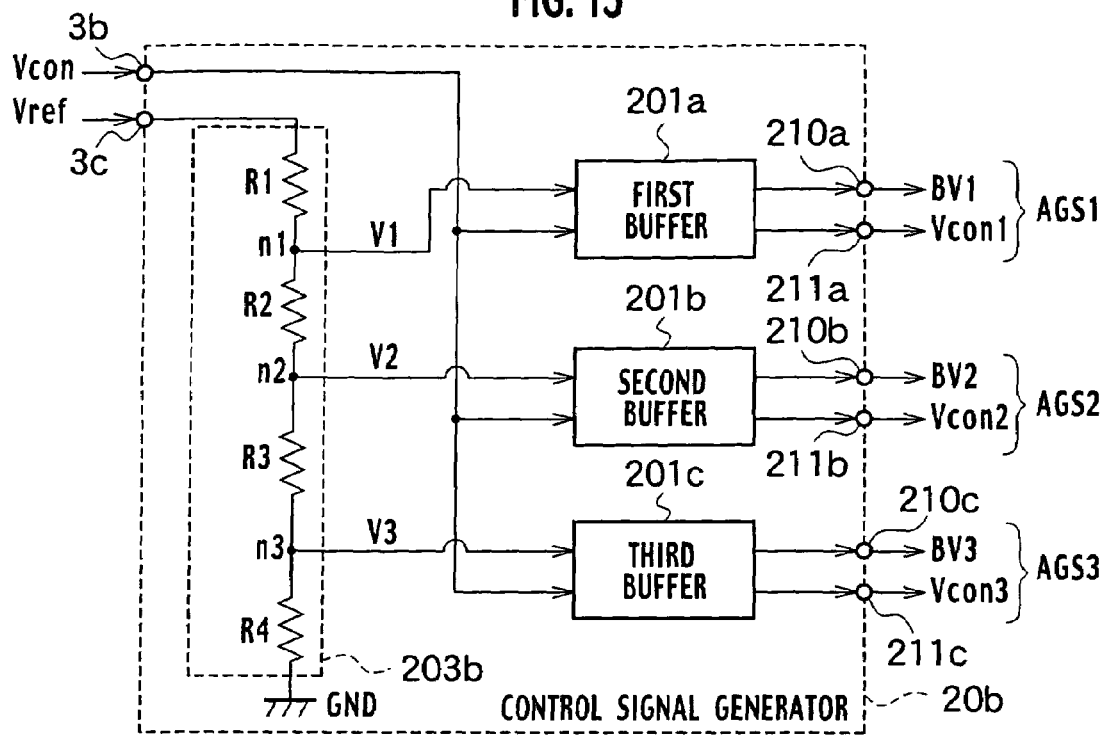
FIG. 15 is a circuit diagram showing a control signal generator according to the third embodiment.

As shown in FIG. 15, the control signal generator 20b further includes a third buffer 201c. The third buffer 201c generates the third control signal AGS3. The voltage divider 203b further includes a fourth dividing-resistance R4 connected between the third dividing-resistance R3 and the ground GND.

Figure 16:
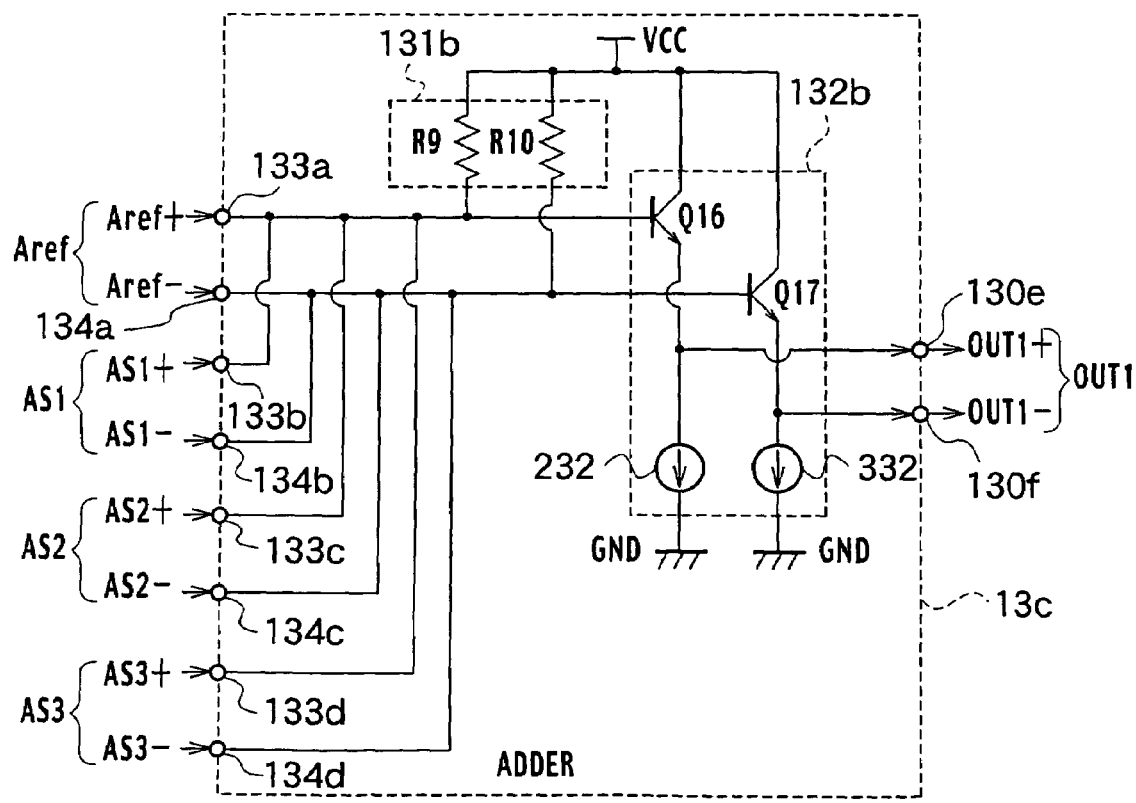
FIG. 16 is a circuit diagram showing an adder according to the third embodiment.

As shown in FIG. 16, the adder 13c further includes a second positive addition current input terminal 133c, a second negative addition current input terminal 134c, a third positive addition current input terminal 133d, and a third negative addition current input terminal 134d.

Figure 17:
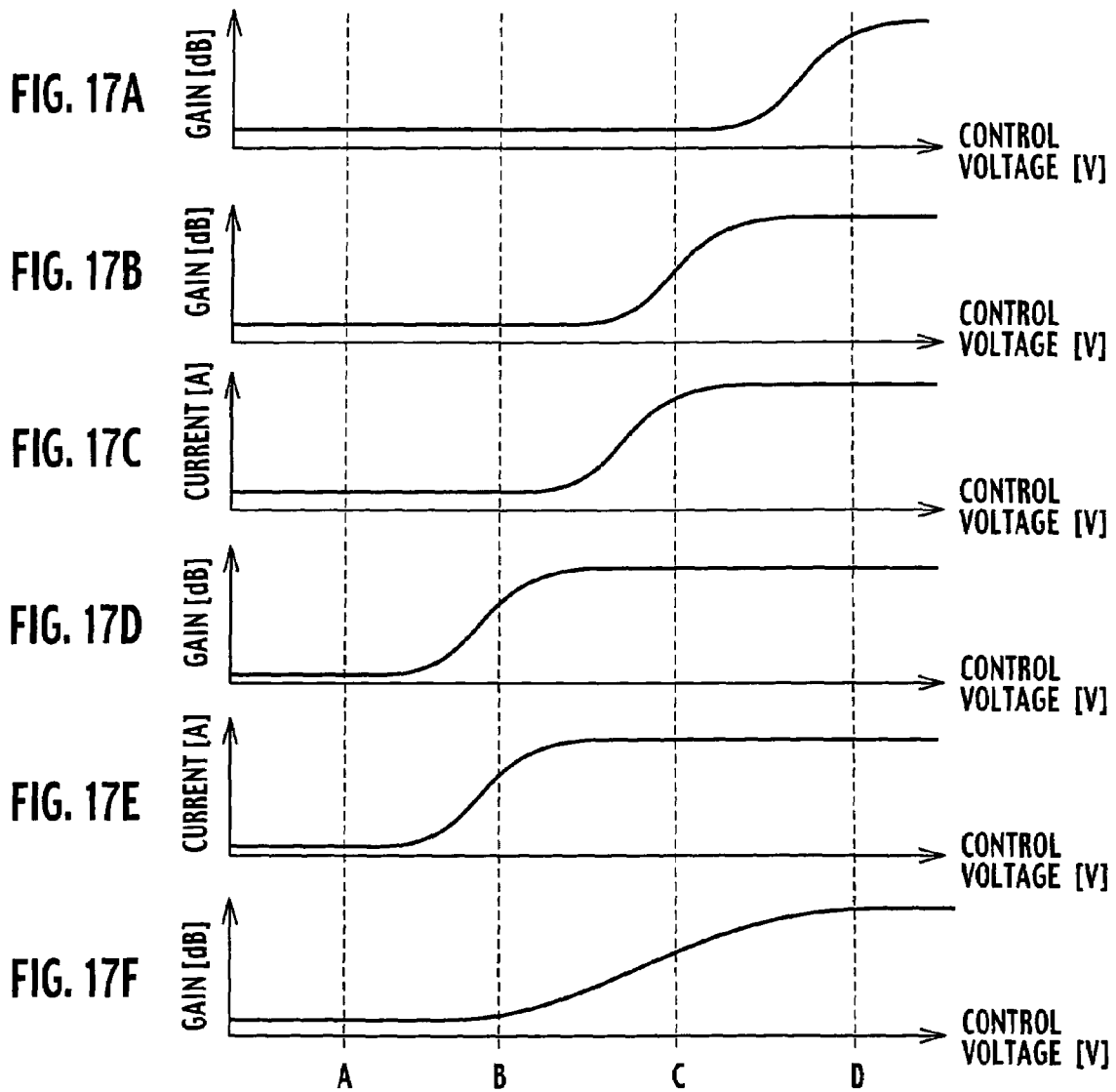
FIGS. 17A to 17F are graphs showing an operation of the variable gain amplifier according to the third embodiment.

Next, an operation of the variable gain amplifier 10d according to the third embodiment of the present invention will be described by referring to FIGS. 14 to 17F. An example in which the voltage gain of the entire variable gain amplifier 10d is controlled from a high gain to a low gain will be described. However, repeated descriptions for the same operation according to the third embodiment which are the same as the first and second embodiments are omitted. Here, FIG. 17A shows the gain of the third gain controller 14c shown in FIG. 14, FIG. 17B shows the gain of the second gain controller 14b, FIG. 17C shows the second variable current AC2, FIG. 17D shows the gain of the first gain controller 14a, FIG. 17E shows the first variable current AC1, and FIG. 17F shows the voltage gain of whole variable gain amplifier 10d.

(A) As shown in FIG. 17A, when the voltage value of the control voltage Vcon is from about D [V] to C [V], the control signal generator 20b shown in FIG. 14 decreases the gain of the third gain controller 14c by generating the first control signal AGS1, and decreases the third addition current AS3.

(B) As shown in FIG. 17B, when the voltage value of the control voltage Vcon is about C [V], the control signal generator 20b decreases the gain of the second gain controller 14b by generating the second control signal AGS2, and decreases the second addition current AS2.

(C) As shown in FIG. 17C, when the voltage value of the control voltage Vcon is from about C [V] to B [V], second bias current generator 22d shown in FIG. 14 decreases the output current of the second variable current amplifier 12b, that is, the second variable current AC2 based on the second control signal AGS2.

(D) As shown in FIG. 17D, at the voltage value of the control voltage Vcon is about B [V], the control signal generator 20b decreases the gain of the first gain controller 14a by generating the third control signal AGS3, and decreases the first addition current AS1. As shown in FIG. 17F, when the voltage value of the control voltage Vcon is from A [V] to D [V], the voltage gain of the entire variable gain amplifier 10d is decreased.

(E) As shown in FIG. 17E, when the voltage value of the control voltage Vcon is about B [V], the first bias current generator 22c decreases the output current of the first variable current amplifier 12a, that is, the first variable current AC1 based on the third control signal AGS3.

As described above, according to third embodiment, it is possible to provide a variable gain amplifier 10d capable of operating with low power consumption. Furthermore, since each output of the second constant current amplifier 11b, the first variable current amplifier 12a, the second variable current amplifier 12b, the first gain controller 14a, the second gain controller 14b, and the third gain controller 14c is current, it is possible to reduce the amount of resistance for generating voltage in the variable gain amplifier 10d.

Fourth Embodiment

Figure 18:
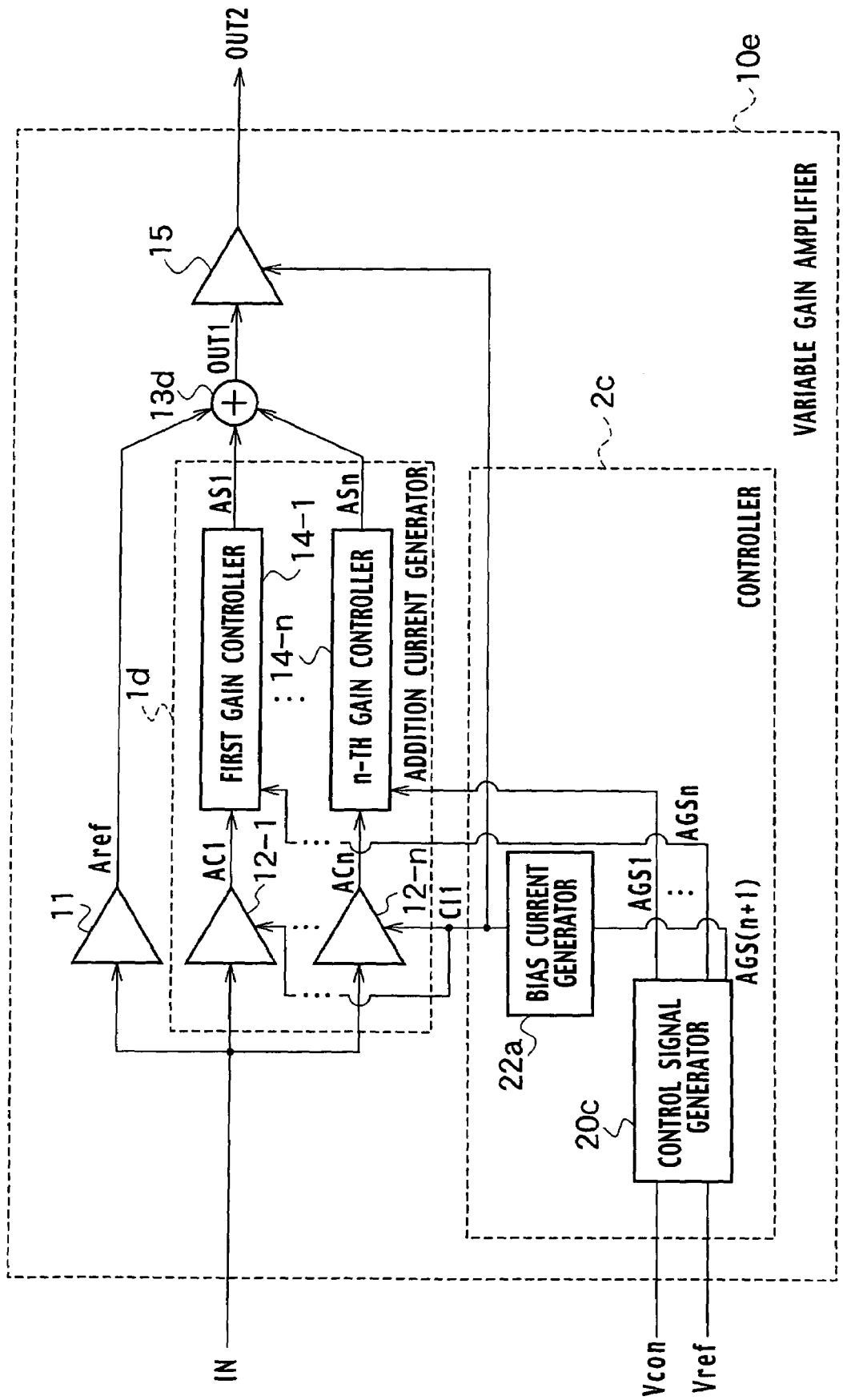
FIG. 18 is a block diagram showing a variable gain amplifier according to a fourth embodiment of the present invention.

As shown in FIG. 18, a variable gain amplifier 10e according to a fourth embodiment of the present invention differs from the variable gain amplifier 10a shown in FIG. 1 in that the addition current generator 1d includes first to n-th variable current amplifiers 12-1 to 12-n, and first to n-th gain controller 14-1 to 14-n connected to the first to n-th variable current amplifiers 12-1 to 12-n (n being an integer equal to or greater than 2). Moreover, a controller 2c differs from the controller 2a shown in FIG. 1 in that the controller 2c supplies first to n-th gain control signals AGS1 to AGSn to the first to n-th gain controllers 14-1 to 14-n. The first to n-th variable current amplifiers 12-1 to 12-n generate first to n-th variable currents AC1 to ACn based on the bias current CI1. The first to n-th gain controllers 14-1 to 14-n generate first to n-th addition currents AS1 to ASn by controlling the first to n-th variable currents AC1 to ACn based on the first to n-th control signals AGS1 to AGSn. The control signal generator 20c supplies the (n+1)-th control signal AGS(n+1) to the bias current generator 22a. Other compositions are similar to the variable gain amplifier 10a shown in FIG. 1.

Each maximum output current of the first to n-th variable current amplifiers 12-1 to 12-n is set as the first variable current amplifier 12-1<the second variable current amplifier 12-2<the third variable current amplifier 12-3< . . .

Figure 19:
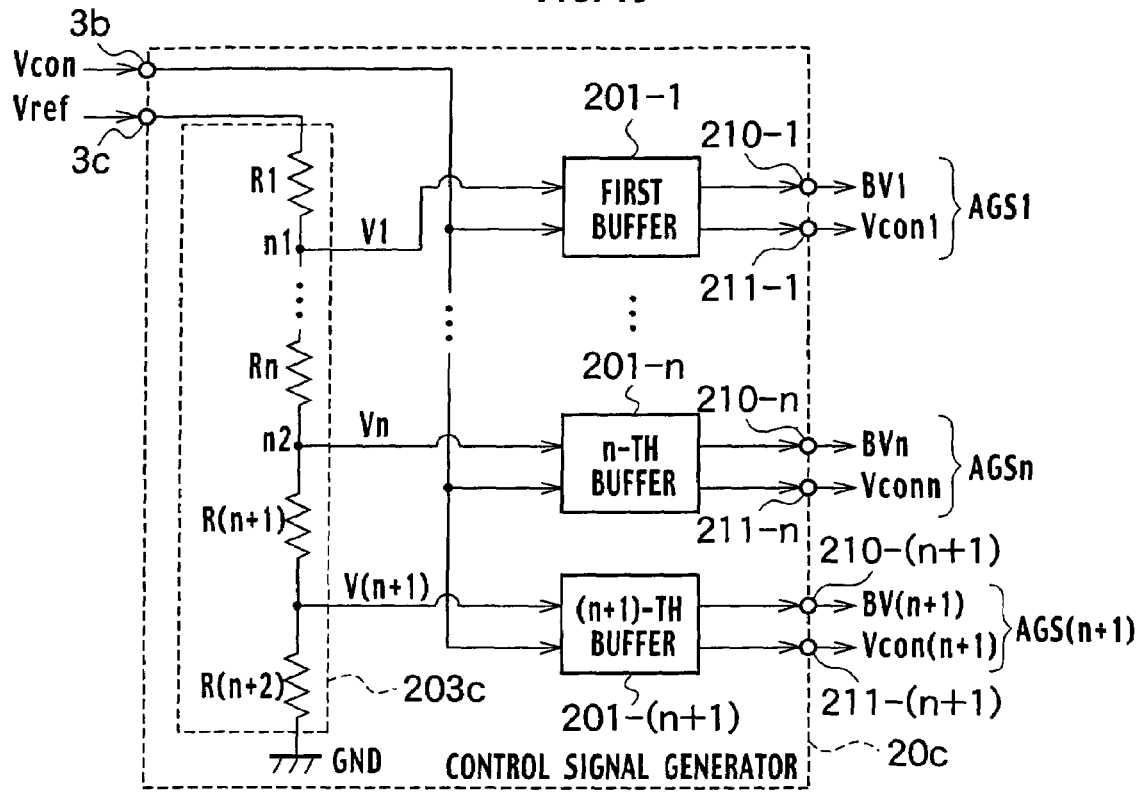
FIG. 19 is a circuit diagram showing a control signal generator according to the fourth embodiment.
Figure 20:
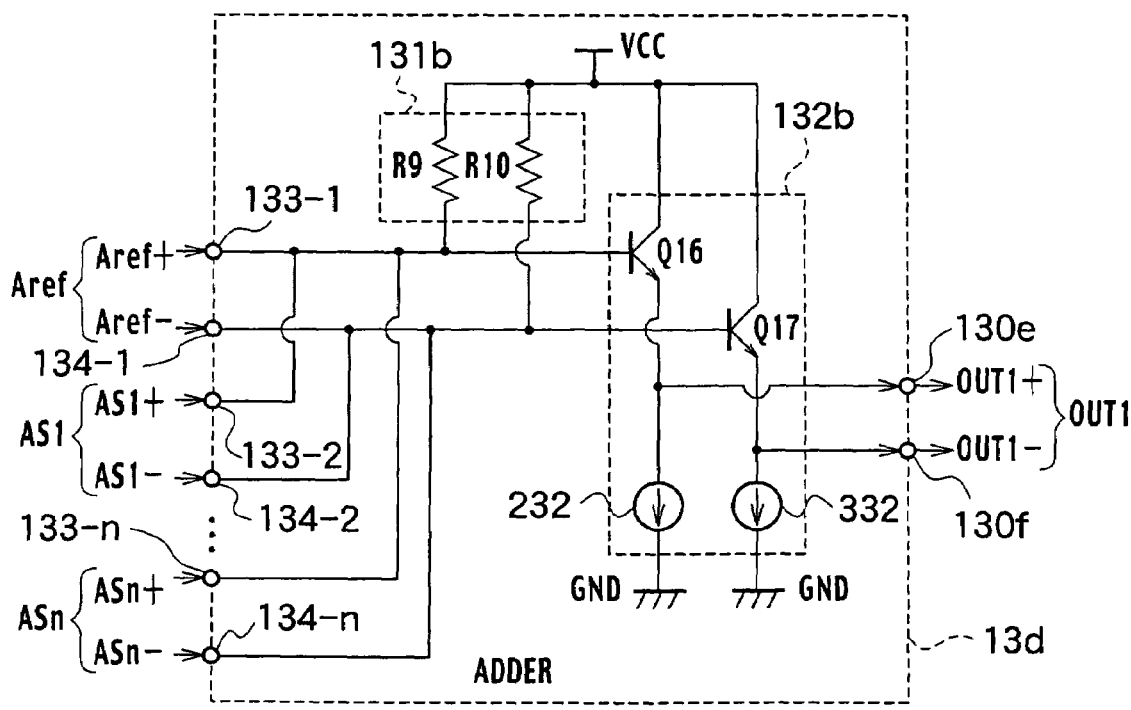
FIG. 20 is a circuit diagram showing an adder according to the fourth embodiment.

As shown in FIG. 19, the control signal generator 20c includes first to (n+1)-th buffers 201-1 to 201-(n+1). The voltage divider 203c includes first to (n+2)-th dividing-resistances R1 to R(n+2). As shown in FIG. 20, the adder 13d has a configuration capable of dealing with the first to n-th addition currents AS1 to ASn.

Moreover, regarding the variable gain amplifier 10d, when each input dynamic range of the constant current amplifier 11 and the variable current amplifiers 12-1 to 12-n is equal, the following equation (4) is established:

$$DR = 20\log\{(Aref + AC1 + \ldots + ACn)/Aref\} \quad (4)$$

where, "Aref" [A] is the reference current Aref, "AC1" [A] is the first variable current AC1, ACn [A] is the n-th variable current ACn, and the "DR" [dB] is the variable gain width of the variable gain amplifier 10e.

Next, an operation of the variable gain amplifier 10e according to the fourth embodiment of the present invention will be described by referring to FIGS. 18 to 21E. An example in which the voltage gain of the entire variable gain amplifier 10e is controlled from a high gain to a low gain will be described. It is assumed that number of each of the first to n-th variable current amplifiers 12-1 to 12-n and the first to n-th gain controllers 14-1 to 14-n is 2, that is, the variable gain amplifier 10e includes the first variable current amplifier 12-1, the second variable current amplifier 12-2, the first gain controller 14-1, and the second gain controller 14-2. Repeated descriptions for the same operation according to the second embodiment which are the same as the first embodiment are omitted. Here, FIG. 21A shows the gain of the second gain controller 14-2, FIG. 21B shows the gain of the first gain controller 14-1, FIG. 21C shows the second variable current AC2, FIG. 21D shows the first variable current AC1, and FIG. 21E shows the voltage gain of whole variable gain amplifier 10e.

Figure 21A:
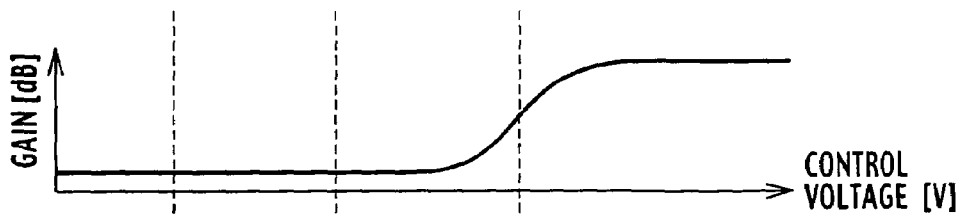
FIGS. 21A to 21E are graphs showing an operation of the variable gain amplifier according to the fourth embodiment.

(A) As shown in FIG. 21A, when the voltage value of the control voltage Vcon is in the neighborhood of C [V], the control signal generator 20c shown in FIG. 18 decreases the gain of the second gain controller 14-2 and the second addition current AS2.

Figure 21B:
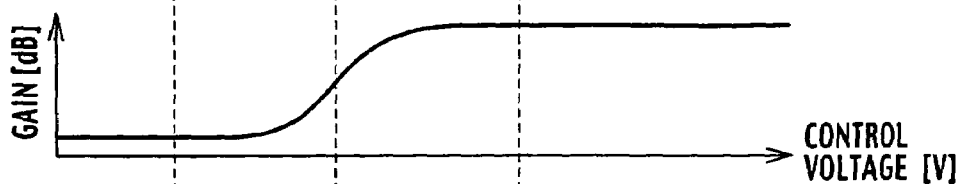

(B) As shown in FIG. 21B, when the voltage value of the control voltage Vcon is in the neighborhood of B [V], the control signal generator 20c decreases the gain of the first gain controller 14-1 and the first addition current AS1. As shown in FIG. 21E, when the voltage value of the control voltage Vcon is from C [V] to B [V], the voltage gain of the entire variable gain amplifier 10e is decreased.

Figure 21C:
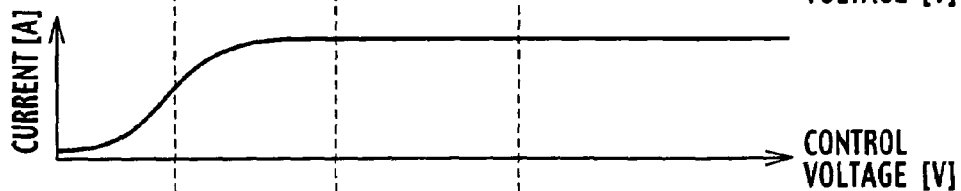
Figure 21D:
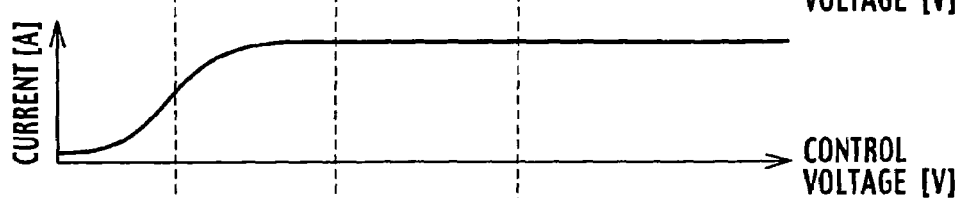
Figure 21E:
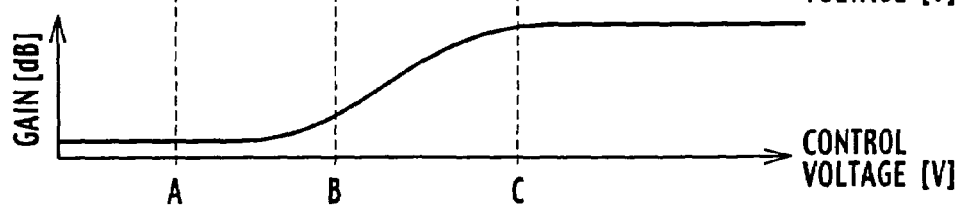

(C) As shown in FIG. 21C, when the voltage value of the control voltage Vcon is in the neighborhood of A [V], the bias current generator 22a shown in FIG. 18 decreases the output current of the first variable current amplifier 12-1 and the second variable current amplifier 12-2, that is, the first variable current AC1 and the second variable current AC2. As shown in FIG. 21D, the bias current generator 22a decreases the output current of the output amplifier 15.

As described above, the variable gain amplifier 10e according to the fourth embodiment, it is possible to reduce the power consumption of the first to n-th variable current amplifiers 12-1 to 12-n in periods of low voltage gain of the variable gain amplifier 10e. Moreover, it is possible to reduce the number of the resistances for generating voltages.

Other Embodiments

Various modifications will become possible for those skilled in the art after receiving the teachings of the present disclosure without departing from the scope thereof.

Figure 22:
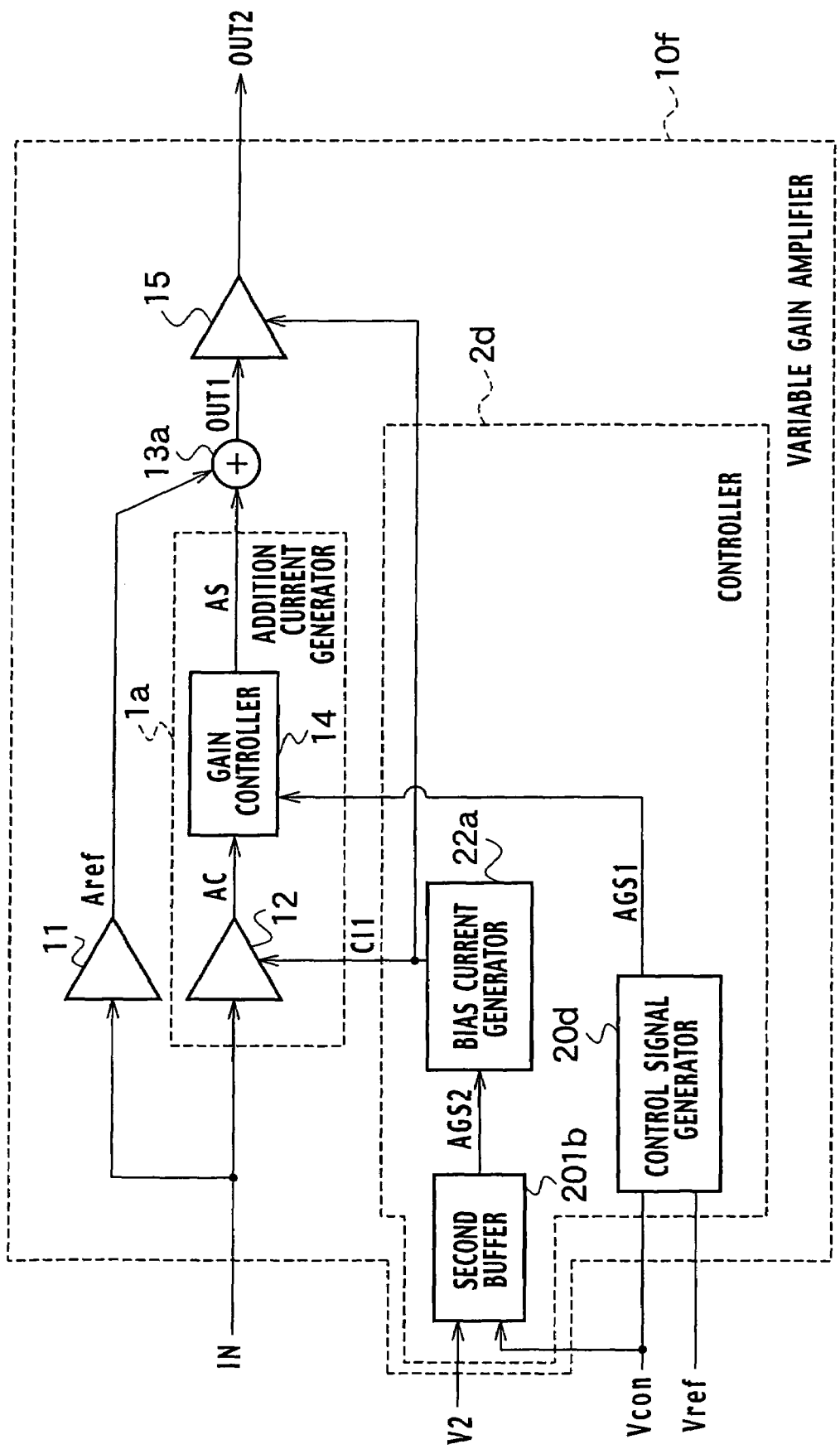
FIG. 22 is a block diagram showing a variable gain amplifier according to other embodiments.

As a variable gain amplifier 10f according to the other embodiment, as shown in FIG. 22, the second buffer 201b shown in FIG. 2 may be arranged outside of the control signal generator 20d. The second buffer 201b shown in FIG. 22 receives the voltage V2 and the control voltage Vcon from the exterior circuit. Accordingly, it is possible to control the bias current CI1 by controlling the voltage value of the voltage V2. Regarding the control signal generator 20b shown in FIG. 15 and the control signal generator 20c shown in FIG. 19, a part of the buffers may be controlled directly from the exterior circuit.

With respect to the aforementioned first embodiment, description was given of an example in which each resistance value of the first dividing-resistance R1, the second dividing-resistance R2, and the third dividing-resistance R3 configuring the voltage divider 203a shown in FIG. 2 is fixed. However, when the sum of each resistance value of the first dividing-resistance R1, the second dividing-resistance R2, and the third dividing-resistance R3 is equal, variable resistances can be used as the first dividing-resistance R1, the second dividing-resistance R2, and the third dividing-resistance R3.

In the aforementioned variable gain amplifier 10a according to the first embodiment, description was given of an example in which the constant current amplifier 11, the addition current generator 1a, the controllers 2a and 2b, the adder 13a, and the output amplifier 15 are configured as differential circuits. However, it is possible to use only one transistor of the differential transistor pair included in the constant current amplifier 11, the addition current generator 1a, the controllers 2a and 2b, the adder 13a, and the output amplifier 15. Similarly, it can be adapted to the variable gain amplifiers 10c to 10e according to the second to fourth embodiments.

Moreover, the variable gain amplifiers 10a to 10e according to the first to fourth embodiment can be monolithically integrated on a chip so as to form a semiconductor integrated circuit on a single semiconductor chip.

Furthermore, description was given of an example in which bipolar junction transistors are used as the transistors included in the variable gain amplifiers 10a to 10e according to the first to fourth embodiments. However, various transistors can be used such as junction field effect transistors (JFET), metal-semiconductor field effect transistors (MESFET), static induction transistors (SIT), and high electron mobility transistors (HEMT).

What is claimed is:

1. A variable gain amplifier comprising:
    a first constant current amplifier configured to generate a reference current from an input signal;
    a controller configured to generate a bias current and a first control signal based on a control voltage;
    an addition current generator configured to generate a variable current from the input signal based on the bias current, and to generate an addition current by controlling the variable current in accordance with the first control signal; and
    an adder configured to generate a first output signal by adding the reference current and the addition current.

2. The variable gain amplifier of claim 1, wherein the controller decreases the variable current after decreasing the addition current when controlling from a high gain to a low gain.

3. The variable gain amplifier of claim 1, further comprising an output amplifier configured to amplify the first output signal to provide a second output signal.

4. The variable gain amplifier of claim 3, wherein the controller decreases an output current of the output amplifier when controlling from a high gain to a low gain.

5. The variable gain amplifier of claim 1, wherein the adder comprises:
    a current-voltage converter configured to generate a voltage in accordance with a sum of the reference current and the addition current; and
    a voltage outputting circuit configured to generate the first output signal based on the voltage generated by the current-voltage converter.

6. The variable gain amplifier of claim 1, wherein the addition current generator comprises:
    a variable current amplifier configured to generate the variable current based on the bias current; and
    a gain controller configured to generate the addition current in accordance with the first control signal.

7. The variable gain amplifier of claim 6, wherein the variable current amplifier comprises:
    a variable current source configured to generate a current in accordance with the bias current; and
    a first differential transistor pair configured to generate the variable current by amplifying the current supplied by the variable current source in accordance with the input signal.

8. The variable gain amplifier of claim 7, wherein the gain controller comprises second and third differential transistor pairs configured to control the variable current in accordance with the first control signal.

9. The variable gain amplifier of claim 1, wherein the controller comprises:
    a control signal generator configured to generate a second control signal and the first control signal based on a potential difference of a reference voltage and the control voltage; and
    a bias current generator configured to generate the bias current in accordance with the second control signal.

10. The variable gain amplifier of claim 9, wherein the control signal generator comprises:
    a voltage divider configured to generate first and second voltages by dividing the reference voltage;
    a first buffer configured to generate the first control signal in accordance with a potential difference of the control voltage and the first voltage; and
    a second buffer configured to generate the second control signal in accordance with a potential difference of the control voltage and the second voltage.

11. The variable gain amplifier of claim 9, wherein the bias current generator comprises:
    a current mirror circuit configured to generate the bias current; and
    a differential amplifier configured to supply a current to the current mirror circuit in accordance with the second control signal.

12. The variable gain amplifier of claim 9, wherein the addition current generator comprises:
    a second constant current amplifier configured to generate a constant current from the input signal;
    a first gain controller configured to generate a first addition current as the addition current by controlling the constant current in accordance with the second control signal;
    a variable current amplifier configured to generate the variable current based on the bias current; and
    a second gain controller configured to generate a second addition current as the addition current by controlling the variable current in accordance with the first control signal.

13. The variable gain amplifier of claim 12, wherein the controller decreases the variable current and the first addition current after decreasing the second addition current in case of controlling from a high gain to a low gain.

14. The variable gain amplifier of claim 1, wherein the controller comprises:
    a control signal generator configured to generate a plurality of control signals based on a potential difference of a reference voltage and the control voltage; and
    a bias current generator configured to generate the bias current based on the control signal.

15. The variable gain amplifier of claim 14, wherein the addition current generator comprises:
    a plurality of variable current amplifiers configured to generate a corresponding number of variable currents as the variable current based on the bias current; and
    a plurality of gain controllers configured to control the variable currents in accordance with the control signals, and to generate a plurality of addition currents as the addition current.

16. A variable gain amplifier comprising:
    a first constant current amplifier configured to generate a reference current from an input signal;
    a controller configured to generate first and second bias currents and first to third control signals based on a control voltage;

an addition current generator configured to generate first to third addition currents based on the first and second bias currents and the first to third control signals; and an adder configured to generate a first output signal by adding the reference current and the first to third addition currents.

17. The variable gain amplifier of claim 16, wherein the adder comprises:

a current-voltage converter configured to generate a voltage in accordance with a sum of the reference current and the first to third addition currents; and a voltage outputting circuit configured to generate the first output signal based on the voltage generated by the current-voltage converter.

18. The variable gain amplifier of claim 16, wherein the controller comprises:

a control signal generator configured to generate the first to third control signals based on a potential difference of a reference voltage and the control voltage;

a first bias current generator configured to generate the first bias current in accordance with the third control signal; and a second bias current generator configured to generate the second bias current in accordance with the second control signal.

19. The variable gain amplifier of claim 16, wherein the addition current generator comprises:

a second constant current amplifier configured to generate a constant current from the input signal;

a first gain controller configured to generate the first addition current by controlling the constant current in accordance with the third control signal;

a first variable current amplifier configured to generate a first variable current based on the first bias current;

a second gain controller configured to generate the second addition current by controlling the first variable current in accordance with the second control signal;

a second variable current amplifier configured to generate a second variable current based on the second bias current; and a third gain controller configured to generate the third addition current by controlling the second variable current in accordance with the first control signal.

20. The variable gain amplifier of claim 19, wherein the controller decreases the third addition current, the second addition current, and the first addition current in this order when controlling from a high gain to a low gain.

* * * * *